(12) United States Patent
McCain

(10) Patent No.: US 9,413,405 B2
(45) Date of Patent: *Aug. 9, 2016

(54) MICROELECTRONIC DEVICE WITH INTEGRATED ENERGY SOURCE

(71) Applicant: Joseph H. McCain, Celina, TX (US)

(72) Inventor: Joseph H. McCain, Celina, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 14/730,617

(22) Filed: Jun. 4, 2015

(65) Prior Publication Data

US 2015/0270860 A1 Sep. 24, 2015

Related U.S. Application Data

(63) Continuation of application No. 13/764,432, filed on Feb. 11, 2013, now Pat. No. 9,099,410, which is a continuation of application No. 13/180,540, filed on Jul. 11, 2011, now Pat. No. 8,373,559, which is a (Continued)

(51) Int. Cl.
| | |
|---|---|
| *H04B 1/16* | (2006.01) |
| *G06K 19/07* | (2006.01) |
| *G06K 19/077* | (2006.01) |

(Continued)

(52) U.S. Cl.
CPC .......... *H04B 1/1615* (2013.01); *G06K 19/0702* (2013.01); *G06K 19/07749* (2013.01); *H01L 27/3227* (2013.01); *H01L 31/04* (2013.01); *H04B 1/04* (2013.01); *H01L 23/49593* (2013.01); *H01L 2224/48091* (2013.01); *H01L 2924/12041* (2013.01); *H01L 2924/12044* (2013.01); *H01L 2924/1461* (2013.01); *H01L 2924/30107* (2013.01)

(58) Field of Classification Search
CPC ................... H04B 1/1615; H04B 1/04; H01L 2224/48091; H01L 2924/00014; H01L 2924/30107; H01L 2924/00; H01L 2924/1461; H01L 2924/12044; H01L 31/04; H01L 27/3227; H01L 23/49593; H01L 2924/12041; G06K 19/0702; G06K 19/07749

See application file for complete search history.

(56) References Cited

U.S. PATENT DOCUMENTS

| | | | |
|---|---|---|---|
| 4,014,346 | A | 3/1977 | Brownlee |
| 4,024,420 | A | 5/1977 | Anthony et al. |

(Continued)

FOREIGN PATENT DOCUMENTS

| | | |
|---|---|---|
| DE | 68925271 | 8/1996 |
| EP | 0348018 | 2/1983 |

(Continued)

OTHER PUBLICATIONS

Esser, Brian, et al, "Wireless Inductive Robotic Inspection of Structures," Proceedings of IASTED International Conference Robotics and Applications 2000, Aug. 14-16, 2000, p. 1-6.

(Continued)

*Primary Examiner* — Roy Potter

(74) *Attorney, Agent, or Firm* — Boisbrun Hofman, PLLC

(57) ABSTRACT

An apparatus including an electronic device having a plurality of substantially collocated components, the plurality of components including an integrated circuit (IC) chip, an energy supply operable to electrically power the IC chip, and an energy harvesting (EH) device operable to convert non-electrical energy to electrical energy supplied to the energy supply. A material substantially encloses at least a portion of at least one of the IC chip, the energy supply, and the EH device.

21 Claims, 19 Drawing Sheets

Related U.S. Application Data continuation of application No. 12/467,703, filed on May 18, 2009, now Pat. No. 7,989,936, which is a continuation of application No. 11/259,567, filed on Oct. 25, 2005, now Pat. No. 7,557,433, which is a continuation-in-part of application No. 10/685,825, filed on Oct. 13, 2003, now Pat. No. 7,230,321.

(60) Provisional application No. 60/621,900, filed on Oct. 25, 2004.

(51) Int. Cl.
*H01L 27/32* (2006.01)
*H01L 31/04* (2014.01)
*H04B 1/04* (2006.01)
*H01L 23/495* (2006.01)

(56) References Cited

U.S. PATENT DOCUMENTS

| | | |
|---|---|---|
| 4,042,861 A | 8/1977 | Yasuda et al. |
| 4,151,126 A | 4/1979 | Adelman et al. |
| 4,585,718 A | 4/1986 | Uedaira et al. |
| 4,631,921 A | 12/1986 | Linderfelt |
| 4,655,964 A | 4/1987 | Steinberger et al. |
| 4,759,771 A | 7/1988 | Morra |
| 4,971,868 A | 11/1990 | Tucholski et al. |
| 5,008,776 A | 4/1991 | Queyssac |
| 5,021,129 A | 6/1991 | Arbach et al. |
| 5,089,877 A | 2/1992 | Queyssac et al. |
| 5,110,696 A | 5/1992 | Shokoohi et al. |
| 5,124,782 A | 6/1992 | Hundt et al. |
| 5,130,229 A | 7/1992 | Chang et al. |
| 5,153,710 A | 10/1992 | McCain |
| 5,187,564 A | 2/1993 | McCain |
| 5,196,374 A | 3/1993 | Hundt et al. |
| 5,208,121 A | 5/1993 | Yahnke et al. |
| 5,278,509 A | 1/1994 | Haynes et al. |
| 5,294,829 A | 3/1994 | Hundt |
| 5,309,351 A | 5/1994 | McCain et al. |
| 5,323,150 A | 6/1994 | Tuttle |
| 5,326,652 A | 7/1994 | Lake |
| 5,338,625 A | 8/1994 | Bates et al. |
| 5,403,782 A | 4/1995 | Dixon et al. |
| 5,448,110 A | 9/1995 | Tuttle et al. |
| 5,451,715 A | 9/1995 | Hundt et al. |
| 5,459,360 A | 10/1995 | Varo |
| 5,469,185 A | 11/1995 | Lebby et al. |
| 5,475,259 A | 12/1995 | Kasai et al. |
| 5,497,140 A | 3/1996 | Tuttle |
| 5,498,903 A | 3/1996 | Dixon et al. |
| 5,646,592 A | 7/1997 | Tuttle |
| 5,691,619 A | 11/1997 | Vingsbo |
| RE35,765 E | 4/1998 | Tuttle |
| 5,776,278 A | 7/1998 | Tuttle et al. |
| 5,777,903 A | 7/1998 | Piosenka et al. |
| 5,779,839 A | 7/1998 | Tuttle et al. |
| 5,787,174 A | 7/1998 | Tuttle |
| 5,788,178 A | 8/1998 | Barrett, Jr. |
| 5,864,182 A | 1/1999 | Matsuzaki |
| 5,868,100 A | 2/1999 | Marsh |
| 5,900,671 A | 5/1999 | Takahashi et al. |
| 5,959,529 A | 9/1999 | Kail, IV |
| 6,010,934 A | 1/2000 | Wu |
| 6,013,949 A | 1/2000 | Tuttle |
| 6,045,652 A | 4/2000 | Tuttle et al. |
| 6,054,950 A | 4/2000 | Fontana |
| 6,111,520 A | 8/2000 | Allen et al. |
| 6,125,033 A | 9/2000 | Andre et al. |
| 6,129,449 A | 10/2000 | McCain et al. |
| 6,160,307 A | 12/2000 | Kweon |
| 6,171,378 B1 | 1/2001 | Manginell et al. |
| 6,177,732 B1 | 1/2001 | Zu |
| 6,191,687 B1 | 2/2001 | Dlugos |
| 6,218,049 B1 | 4/2001 | Bates et al. |
| 6,232,880 B1 | 5/2001 | Anderson |
| 6,266,647 B1 | 7/2001 | Fernandez |
| 6,278,056 B1 | 8/2001 | Sugihara et al. |
| 6,289,237 B1 | 9/2001 | Mickle et al. |
| 6,294,281 B1 | 9/2001 | Heller |
| 6,304,056 B1 | 10/2001 | Gale et al. |
| 6,304,176 B1 | 10/2001 | Discenzo |
| 6,306,662 B1 | 10/2001 | Menzel |
| 6,324,429 B1 | 11/2001 | Shire et al. |
| 6,325,294 B2 | 12/2001 | Tuttle et al. |
| 6,329,705 B1 | 12/2001 | Ahmad |
| 6,330,482 B1 | 12/2001 | McCain et al. |
| 6,340,864 B1 | 1/2002 | Wacyk |
| 6,346,343 B1 | 2/2002 | Notten et al. |
| 6,361,660 B1 | 3/2002 | Goldstein |
| 6,379,324 B1 | 4/2002 | Garstein et al. |
| 6,420,293 B1 | 7/2002 | Chang et al. |
| 6,433,465 B1 | 8/2002 | McKnight et al. |
| 6,443,890 B1 | 9/2002 | Schulze et al. |
| 6,458,157 B1 | 10/2002 | Suaning |
| 6,465,129 B1 | 10/2002 | Xu et al. |
| 6,469,499 B2 | 10/2002 | Delaporte |
| 6,479,745 B2 | 11/2002 | Yamanaka et al. |
| 6,487,426 B1 | 11/2002 | Haber |
| 6,497,837 B2 | 12/2002 | Grams et al. |
| 6,500,571 B2 | 12/2002 | Liberatore et al. |
| 6,527,711 B1 | 3/2003 | Stivoric et al. |
| 6,529,131 B2 | 3/2003 | Wentworth |
| 6,538,194 B1 | 3/2003 | Koyanagi et al. |
| 6,541,149 B1 | 4/2003 | Maynard et al. |
| 6,548,751 B2 | 4/2003 | Sverdrup, Jr. et al. |
| 6,549,807 B1 | 4/2003 | Kroll |
| 6,563,132 B1 | 5/2003 | Talroze et al. |
| 6,563,427 B2 | 5/2003 | Bero et al. |
| 6,565,729 B2 | 5/2003 | Chen et al. |
| 6,574,679 B1 | 6/2003 | Chliwnyj |
| 6,580,026 B1 | 6/2003 | Koyanagi et al. |
| 6,604,434 B1 | 8/2003 | Hamilton |
| 6,610,440 B1 | 8/2003 | LaFollette et al. |
| 6,612,188 B2 | 9/2003 | Hamilton |
| 6,613,598 B1 | 9/2003 | Middelman et al. |
| 6,614,392 B2 | 9/2003 | Howard |
| 6,617,976 B2 | 9/2003 | Walden et al. |
| 6,621,687 B2 | 9/2003 | Lewis et al. |
| 6,629,820 B2 | 10/2003 | Kornelsen |
| 6,640,137 B2 | 10/2003 | MacDonald |
| 6,642,853 B2 | 11/2003 | Hunter |
| 6,655,035 B2 | 12/2003 | Ghandi et al. |
| 6,680,094 B2 | 1/2004 | Kikuchi et al. |
| 6,680,142 B2 | 1/2004 | Singh et al. |
| 6,706,402 B2 | 3/2004 | Rueckes et al. |
| 6,718,209 B2 | 4/2004 | Williamson et al. |
| 6,720,879 B2 | 4/2004 | Edwards |
| 6,731,512 B2 | 5/2004 | Nebrigic et al. |
| 6,798,335 B2 | 9/2004 | Miyashita et al. |
| 6,801,137 B2 | 10/2004 | Eggers |
| 6,805,999 B2 | 10/2004 | Lee et al. |
| 6,806,684 B2 | 10/2004 | Matsuyama |
| 6,809,828 B2 | 10/2004 | Bornhop et al. |
| 6,818,356 B1 | 11/2004 | Bates |
| 6,821,797 B2 | 11/2004 | Machida et al. |
| 6,825,032 B2 | 11/2004 | Dapron et al. |
| 6,826,509 B2 | 11/2004 | Crisco, III |
| 6,863,219 B1 | 3/2005 | Jacobsen et al. |
| 6,868,288 B2 | 3/2005 | Thompson |
| 6,879,424 B2 | 4/2005 | Vincent et al. |
| 6,882,128 B1 | 4/2005 | Rahmel et al. |
| 6,882,315 B2 | 4/2005 | Richley et al. |
| 6,893,396 B2 | 5/2005 | Schulze et al. |
| 6,903,366 B2 | 6/2005 | Heath et al. |
| 6,903,682 B1 | 6/2005 | Maddox |
| 6,916,679 B2 | 7/2005 | Snyder et al. |
| 6,931,379 B1 | 8/2005 | Sato et al. |
| 6,939,295 B2 | 9/2005 | Yokoi et al. |
| 6,970,745 B2 | 11/2005 | Scribner |
| 6,976,998 B2 | 12/2005 | Rizzo |
| 6,992,463 B2 | 1/2006 | Yoshio |
| 6,994,933 B1 | 2/2006 | Bates |
| 7,009,634 B2 | 3/2006 | Iddan et al. |

(56) References Cited

U.S. PATENT DOCUMENTS

| | | |
|---|---|---|
| 7,010,182 B2 | 3/2006 | Pennington |
| 7,052,587 B2 | 5/2006 | Gibson et al. |
| 7,058,247 B2 | 6/2006 | Crow et al. |
| 7,064,879 B1 | 6/2006 | Levitan et al. |
| 7,065,658 B1 | 6/2006 | Baraban et al. |
| 7,068,124 B2 | 6/2006 | White et al. |
| 7,081,693 B2 | 7/2006 | Hamel et al. |
| 7,129,842 B2 | 10/2006 | Hope |
| 7,144,654 B2 | 12/2006 | LaFollette et al. |
| 7,149,773 B2 | 12/2006 | Haller et al. |
| 7,160,637 B2 | 1/2007 | Chiao et al. |
| 7,166,384 B2 | 1/2007 | LaFollette et al. |
| 7,171,849 B2 | 2/2007 | Kandler |
| 7,176,808 B1 | 2/2007 | Broad et al. |
| 7,215,991 B2 | 5/2007 | Besson et al. |
| 7,226,442 B2 | 6/2007 | Sheppard, Jr. et al. |
| 7,226,697 B2 | 6/2007 | Nakahara et al. |
| 7,227,173 B2 | 6/2007 | Holonyak, Jr. et al. |
| 7,228,136 B2 | 6/2007 | Myllymaki et al. |
| 7,229,273 B2 | 6/2007 | Bailey et al. |
| 7,230,321 B2 | 6/2007 | McCain |
| 7,230,532 B2 | 6/2007 | Albsmeier et al. |
| 7,238,268 B2 | 7/2007 | Ramsey et al. |
| 7,253,431 B2 | 8/2007 | Afzali-Ardankani et al. |
| 7,253,494 B2 | 8/2007 | Mino et al. |
| 7,255,551 B2 | 8/2007 | Taylor |
| 7,259,669 B2 | 8/2007 | Cargonja et al. |
| 7,264,972 B2 | 9/2007 | Foster |
| 7,274,118 B2 | 9/2007 | Jenson et al. |
| 7,277,284 B2 | 10/2007 | Lee |
| 7,304,591 B2 | 12/2007 | Raphaeli |
| 7,312,518 B2 | 12/2007 | Liao et al. |
| 7,323,033 B2 | 1/2008 | Kroupenkine et al. |
| 7,332,363 B2 | 2/2008 | Edwards |
| 7,338,584 B2 | 3/2008 | Ono |
| 7,339,636 B2 | 3/2008 | Voloschenko et al. |
| 7,345,372 B2 | 3/2008 | Roberts et al. |
| 7,361,998 B2 | 4/2008 | Hamel et al. |
| 7,362,663 B2 | 4/2008 | Kagan |
| 7,386,404 B2 | 6/2008 | Cargonja et al. |
| 7,387,765 B2 | 6/2008 | Chen et al. |
| 7,387,852 B2 | 6/2008 | Lee |
| 7,389,674 B2 | 6/2008 | Bulst et al. |
| 7,390,336 B2 | 6/2008 | Vallee et al. |
| 7,392,022 B2 | 6/2008 | Albsmeier et al. |
| 7,395,474 B2 | 7/2008 | Maltseff et al. |
| 7,399,394 B2 | 7/2008 | Weber |
| 7,399,553 B2 | 7/2008 | Ishii et al. |
| 7,399,554 B2 | 7/2008 | Kejha |
| 7,399,556 B2 | 7/2008 | Lee et al. |
| 7,400,248 B2 | 7/2008 | Yarvis |
| 7,402,909 B2 | 7/2008 | Suh et al. |
| 7,402,910 B2 | 7/2008 | Bottner et al. |
| 7,403,808 B2 | 7/2008 | Istvan et al. |
| 7,417,582 B2 | 8/2008 | Troutman et al. |
| 7,429,805 B2 | 9/2008 | Hamel et al. |
| 7,433,655 B2 | 10/2008 | Jacobs et al. |
| 7,437,156 B2 | 10/2008 | Tanno et al. |
| 7,446,707 B2 | 11/2008 | Poe et al. |
| 7,466,224 B2 | 12/2008 | Ward et al. |
| 7,479,944 B2 | 1/2009 | Casebolt et al. |
| 7,495,567 B2 | 2/2009 | Redler et al. |
| 7,511,604 B2 | 3/2009 | Raphaeli et al. |
| 7,511,681 B2 | 3/2009 | Bolin |
| 7,518,283 B2 | 4/2009 | Pinkerton et al. |
| 7,519,025 B2 | 4/2009 | Hiyama et al. |
| 7,519,136 B2 | 4/2009 | Qi et al. |
| 7,524,580 B1 | 4/2009 | Birke et al. |
| 7,529,217 B2 | 5/2009 | Pister et al. |
| 7,530,257 B2 | 5/2009 | Bonne |
| 7,535,468 B2 | 5/2009 | Uy |
| 7,542,437 B1 | 6/2009 | Redi et al. |
| 7,551,568 B2 | 6/2009 | Jeong et al. |
| 7,551,892 B1 | 6/2009 | Elliott |
| 7,554,299 B2 | 6/2009 | Broad |
| 7,557,433 B2 * | 7/2009 | McCain ............ G06K 19/0702 257/414 |
| 7,557,539 B2 | 7/2009 | Takagi et al. |
| 7,573,634 B2 | 8/2009 | Schmidt |
| 7,577,458 B2 | 8/2009 | Lin |
| 7,580,391 B1 | 8/2009 | Leung |
| 7,580,897 B2 | 8/2009 | Sakamura et al. |
| 7,582,329 B2 | 9/2009 | Schmitz et al. |
| 7,632,602 B2 | 12/2009 | Lee et al. |
| 7,642,011 B2 | 1/2010 | Nakahara et al. |
| 7,881,239 B2 | 2/2011 | Pister et al. |
| 7,953,451 B2 | 5/2011 | Smith et al. |
| 7,953,454 B2 | 5/2011 | Ihara et al. |
| 7,989,936 B2 | 8/2011 | McCain |
| 8,373,559 B2 | 2/2013 | McCain |
| 9,099,410 B2 | 8/2015 | McCain |
| 2001/0027384 A1 | 10/2001 | Schulze et al. |
| 2002/0019584 A1 | 2/2002 | Schulze et al. |
| 2002/0037756 A1 | 3/2002 | Jacobs et al. |
| 2002/0078741 A1 | 6/2002 | Cantu et al. |
| 2002/0173704 A1 | 11/2002 | Schulze et al. |
| 2003/0058118 A1 | 3/2003 | Wilson |
| 2003/0062080 A1 | 4/2003 | Satoh et al. |
| 2003/0141846 A1 | 7/2003 | Matsuyama |
| 2003/0162007 A1 | 8/2003 | Klett et al. |
| 2003/0201520 A1 | 10/2003 | Knapp et al. |
| 2004/0018421 A1 | 1/2004 | LaFollette et al. |
| 2004/0081860 A1 | 4/2004 | Hundt et al. |
| 2004/0096745 A1 | 5/2004 | Shibano et al. |
| 2004/0149489 A1 | 8/2004 | Ferrando et al. |
| 2004/0175626 A1 | 9/2004 | Dasgupta et al. |
| 2004/0201457 A1 | 10/2004 | O'Toole et al. |
| 2005/0026037 A1 | 2/2005 | Riley et al. |
| 2005/0032100 A1 | 2/2005 | Heath et al. |
| 2005/0110457 A1 | 5/2005 | LaFollette et al. |
| 2005/0128560 A1 | 6/2005 | Vincent et al. |
| 2005/0170247 A1 | 8/2005 | Nakahara et al. |
| 2005/0191630 A1 | 9/2005 | Besemer et al. |
| 2005/0213612 A1 | 9/2005 | Pister et al. |
| 2005/0245643 A1 | 11/2005 | Gan et al. |
| 2006/0001137 A1 | 1/2006 | Hundt et al. |
| 2006/0038536 A1 | 2/2006 | LaFollette et al. |
| 2006/0039345 A1 | 2/2006 | Perez-Costa |
| 2006/0049243 A1 | 3/2006 | Sakamura et al. |
| 2006/0073483 A1 | 4/2006 | White et al. |
| 2006/0081042 A1 | 4/2006 | Silverbrook et al. |
| 2006/0255171 A1 | 11/2006 | Krupenkin et al. |
| 2006/0286366 A1 | 12/2006 | Kitano et al. |
| 2007/0009802 A1 | 1/2007 | Lee et al. |
| 2007/0085953 A1 | 4/2007 | Alford et al. |
| 2007/0125638 A1 | 6/2007 | Zhang |
| 2007/0202395 A1 | 8/2007 | Snyder et al. |
| 2007/0264564 A1 | 11/2007 | Johnson |
| 2007/0277044 A1 | 11/2007 | Graf et al. |
| 2008/0003492 A1 | 1/2008 | Bates |
| 2008/0049863 A1 | 2/2008 | Heiskala |
| 2008/0055045 A1 | 3/2008 | Swan et al. |
| 2008/0058614 A1 | 3/2008 | Banet et al. |
| 2008/0071181 A1 | 3/2008 | Stabler et al. |
| 2008/0079444 A1 | 4/2008 | Denison |
| 2008/0096103 A1 | 4/2008 | Naarmann |
| 2008/0122632 A1 | 5/2008 | Copeland |
| 2008/0133635 A1 | 6/2008 | Aunet |
| 2008/0167087 A1 | 7/2008 | Tang et al. |
| 2008/0167094 A1 | 7/2008 | Dinh et al. |
| 2008/0176211 A1 | 7/2008 | Spence et al. |
| 2008/0186136 A1 | 8/2008 | Raphaeli et al. |
| 2008/0186178 A1 | 8/2008 | Tuttle et al. |
| 2014/0027730 A1 | 1/2014 | McCain |

FOREIGN PATENT DOCUMENTS

| | | |
|---|---|---|
| EP | 0369188 | 9/1990 |
| EP | 0526063 | 2/1993 |
| EP | 0539183 | 4/1993 |
| JP | 360007760 A | 1/1985 |
| JP | 404317364 | 11/1992 |
| JP | 6-85162 A | 3/1994 |
| WO | 9854535 A1 | 12/1998 |

(56) References Cited

FOREIGN PATENT DOCUMENTS

| | | |
|---|---|---|
| WO | 9907878 A1 | 2/1999 |
| WO | 9919175 A1 | 4/1999 |
| WO | 9963642 A2 | 12/1999 |
| WO | 0026980 A1 | 5/2000 |
| WO | 0076051 A1 | 12/2000 |
| WO | 0106575 A1 | 1/2001 |
| WO | 0121063 A1 | 3/2001 |
| WO | 0139252 A1 | 5/2001 |
| WO | 0167535 A1 | 9/2001 |
| WO | 0173864 A1 | 10/2001 |
| WO | 0173865 A1 | 10/2001 |
| WO | 0173866 A1 | 10/2001 |
| WO | 0173868 A1 | 10/2001 |
| WO | 0173870 A1 | 10/2001 |
| WO | 0173883 A1 | 10/2001 |
| WO | 0173957 A1 | 10/2001 |
| WO | 0197300 A1 | 12/2001 |
| WO | 0207482 A2 | 1/2002 |
| WO | 0223926 A2 | 3/2002 |
| WO | 02059349 A1 | 8/2002 |
| WO | 02079285 A1 | 10/2002 |
| WO | 02080291 A2 | 10/2002 |
| WO | 02093649 A2 | 11/2002 |
| WO | 02103436 A1 | 12/2002 |
| WO | 02103823 A2 | 12/2002 |
| WO | 02103835 A1 | 12/2002 |
| WO | 03010871 A1 | 2/2003 |
| WO | 03019698 A2 | 3/2003 |
| WO | 03047035 A2 | 6/2003 |
| WO | 03049592 A2 | 6/2003 |
| WO | 03059811 A1 | 7/2003 |
| WO | 03067251 A2 | 8/2003 |
| WO | 03067669 A2 | 8/2003 |
| WO | 03085751 A2 | 10/2003 |
| WO | 03094229 A1 | 11/2003 |
| WO | 03095554 A1 | 11/2003 |
| WO | 03103074 A1 | 12/2003 |
| WO | 03105255 A2 | 12/2003 |
| WO | 03107458 A1 | 12/2003 |
| WO | 03107475 A2 | 12/2003 |
| WO | 2004011978 A1 | 2/2004 |
| WO | 2005098764 A1 | 10/2005 |
| WO | 2005098967 A1 | 10/2005 |
| WO | 2005099419 A2 | 10/2005 |
| WO | 2005100438 A1 | 10/2005 |
| WO | 2005114690 A2 | 12/2005 |
| WO | 2006000910 A1 | 1/2006 |
| WO | 2006009404 A1 | 1/2006 |
| WO | 2006015105 A2 | 2/2006 |
| WO | 2006023940 A2 | 3/2006 |
| WO | 2006028347 A1 | 3/2006 |
| WO | 2006044954 A2 | 4/2006 |
| WO | 2006109464 A1 | 10/2006 |
| WO | 2006124055 A2 | 11/2006 |
| WO | 2006127884 A2 | 11/2006 |
| WO | 2006130766 A2 | 12/2006 |
| WO | 2006131812 A2 | 12/2006 |
| WO | 2006137893 A2 | 12/2006 |
| WO | 2007002683 A2 | 1/2007 |
| WO | 2007011451 A2 | 1/2007 |
| WO | 2007030943 A1 | 3/2007 |
| WO | 2007044034 A2 | 4/2007 |
| WO | 2007044642 A2 | 4/2007 |
| WO | 2007048052 A2 | 4/2007 |
| WO | 2007053191 A2 | 5/2007 |
| WO | 2007076254 A2 | 5/2007 |
| WO | 2007062491 A1 | 6/2007 |
| WO | 2007086830 A2 | 8/2007 |
| WO | 2007088182 A1 | 8/2007 |
| WO | 2007103832 A2 | 9/2007 |
| WO | 2007105196 A1 | 9/2007 |
| WO | 2007109228 A1 | 9/2007 |
| WO | 2007134087 A2 | 11/2007 |
| WO | 2007137795 A1 | 12/2007 |
| WO | 2007143558 A1 | 12/2007 |
| WO | 2007146769 A2 | 12/2007 |
| WO | 2008005431 A2 | 1/2008 |
| WO | 2008030250 A2 | 3/2008 |
| WO | 2008030960 A2 | 3/2008 |
| WO | 2008039170 A2 | 4/2008 |
| WO | 2008039808 A2 | 4/2008 |
| WO | 2008045871 A2 | 4/2008 |
| WO | 2008053008 A2 | 5/2008 |
| WO | 2008060646 A2 | 5/2008 |
| WO | 2008070417 A2 | 6/2008 |
| WO | 2008079670 A1 | 7/2008 |
| WO | 2008081178 A1 | 7/2008 |
| WO | 2008084818 A1 | 7/2008 |
| WO | 2008085974 A2 | 7/2008 |
| WO | 2008086041 A1 | 7/2008 |
| WO | 2008088867 A1 | 7/2008 |

OTHER PUBLICATIONS

Shearwood, C., et al, "Development of an electromagnetic microgenerator," Electronic Letters, Oct. 23, 1997, vol. 33, #22, p. 883-884.

Williams, C.B., et al, "Feasibility study of vibration-electric generator for bridge vibration sensors," IMAC-XVI Proceedings, 1997, p. 1111-1117.

Dlugos, David J. et al, "The Weigand Effect as an Energy Generator," Jul. 20, 2000, 9 pages.

Ching, Neil N.H. et al, A laser-micromachined multi-modal resonating power transducer for wireless sensing systems, 2002, Sensors and Actuators, A 97-98(2002) p. 685-690.

Meninger, Scott, et al, "Vibration-to Electric Energy Conversion," 1999, p. 48-53, Advanced Sensors Consortium.

Shenck, et al, "Energy Scavanging with Shoe-Mounted Piezoelectrics," IEEE computer Society, May 2001, 22 pages, http://computer.org/micro/homepage/may<SUB>-</SUB>june/shenck/index.htm.

* cited by examiner

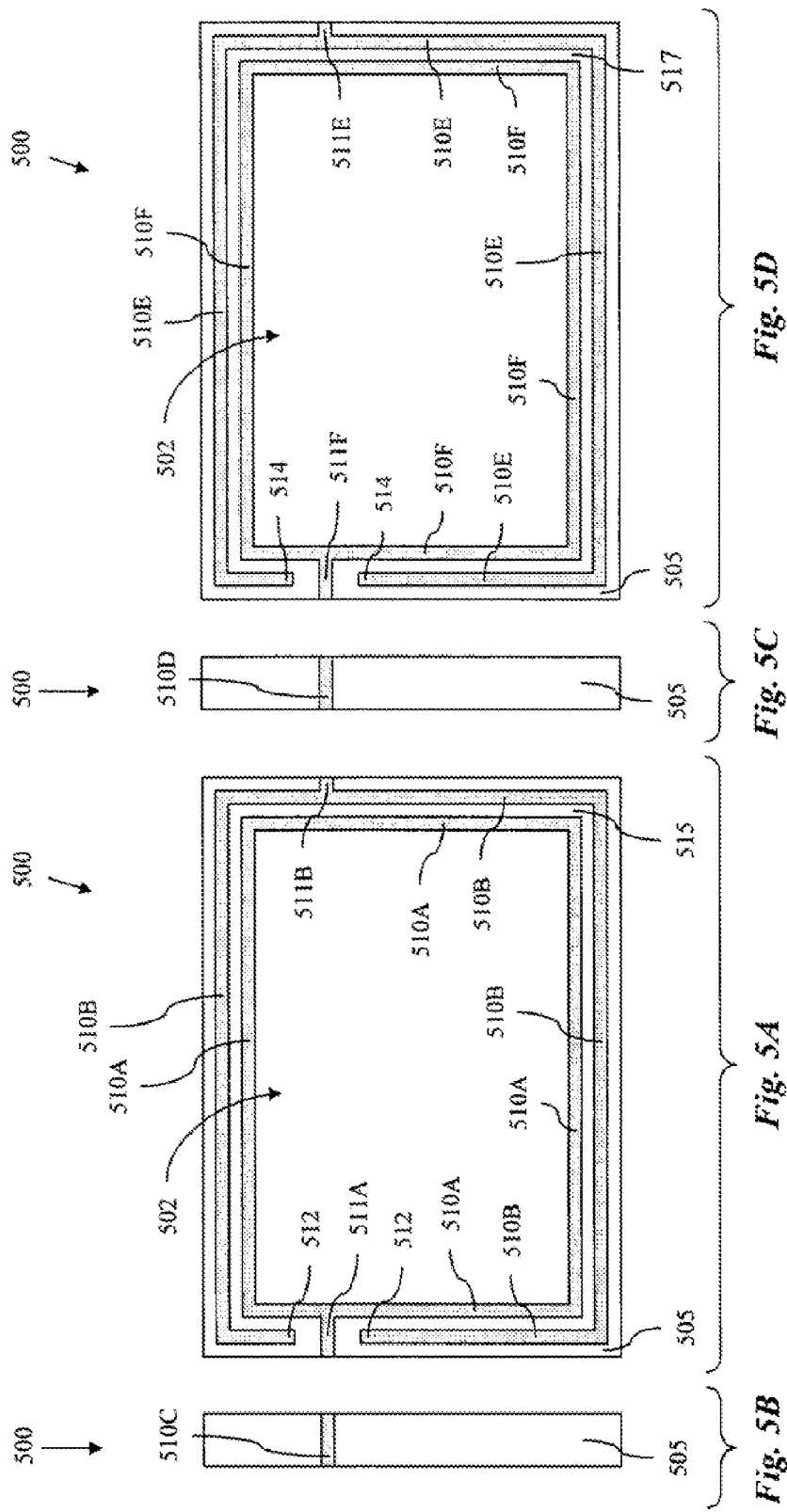

MICROELECTRONIC DEVICE WITH INTEGRATED ENERGY SOURCE

CROSS-REFERENCE TO RELATED APPLICATIONS

This application is a continuation of U.S. patent application Ser. No. 13/764,432, entitled "MICROELECTRONIC DEVICE WITH INTEGRATED ENERGY SOURCE," currently allowed which is a continuation of U.S. patent application Ser. No. 13/180,540, filed Jul. 11, 2011, entitled "MICROELECTRONIC DEVICE WITH INTEGRATED ENERGY SOURCE," now U.S. Pat. No. 8,373,559; which was a continuation U.S. patent application Ser. No. 12/467,703, filed May 18, 2009, entitled "MICROELECTRONIC DEVICE WITH INTEGRATED ENERGY SOURCE," now U.S. Pat. No. 7,989,936; which was a continuation of U.S. patent application Ser. No. 11/259,567, filed Oct. 25, 2005, entitled "MICROELECTRONIC DEVICE WITH INTEGRATED ENERGY SOURCE," now U.S. Pat. No. 7,557,433; which claimed priority to and the benefit of the earlier filing date of U.S. Provisional Patent Application No. 60/621,900, filed Oct. 25, 2004, entitled "Microelectronic device with integrated energy source,". This application is also a continuation-in-part of U.S. patent application Ser. No. 10/685,825, filed Oct. 13, 2003, entitled "Integrated circuit package with laminated power cell having coplanar electrode," now U.S. Pat. No. 7,230,321.

The entire disclosure of each of the above applications/patents is hereby incorporated herein by reference.

BACKGROUND OF THE DISCLOSURE

The continued physical feature size reduction and scaling of self-sustaining, low power consuming, and other microelectronic devices is currently limited in enclosure packaging reductions by the inclusion of a dedicated energy source for operation. For example, many current and future applications require self-sustaining integrated circuit packages and other microelectronic device packages that are able to perform specific functions and operate as independent elements within a sensory, communications, and/or computational network or domain. Such microelectronic device types may be or include single or mixed types of device technologies based on analog, digital, organic, molecular, nano-electronic, micro-electro-mechanical (MEMS), and nano-electro-mechanical (NEMS), among other device type technologies. Existing integration methods which include processes to assemble microelectronic devices with dedicated energy sources into a single product often require excessive semiconductor substrate real estate and/or complex interconnection processes to produce a self-sustainable and operational microelectronic product.

Microelectronic devices in current applications may be utilized as sensors and/or actuators, such as applications in the automotive, telecommunication, computing, consumer, medical, aerospace, and agriculture industries, among others. Such devices may be utilized to sense environmental and/or material characteristics, such as temperature, pressure, voltage, vibration and composition, among others. Such devices may also be employed to trigger actuators for any number of other electrical or mechanical devices. However, while data detected by such devices may be wirelessly transmitted to or received from a peripheral unit through existing wireless protocols (e.g., IEEE 802.11, BLUETOOTH, WiFi, WiMAX, software defined radio, and ultra wide band (UWB), among others) the devices must still be tethered or "plugged-in" to a power source to enable the sensing and wireless processing events. This fact can impose significant limitations on the implementation of sensors in many applications.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 5A is a top view of at least a portion of an embodiment of apparatus according to aspects of the present disclosure.

FIG. 5B is a left side view of the apparatus shown in FIG. 5A.

FIG. 5C is a bottom view of the apparatus shown in FIG. 5A.

FIG. 5D is a right side view of the apparatus shown in FIG. 5A.

DETAILED DESCRIPTION

Figure 1A:
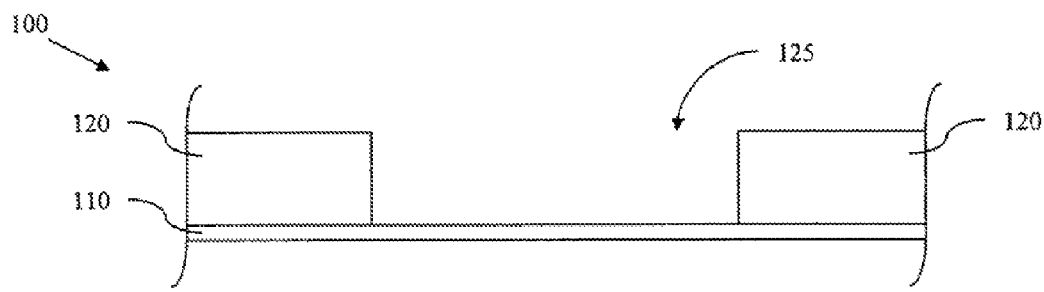
FIG. 1A is a sectional view of at least a portion of an embodiment of apparatus in an intermediate stage of manufacture according to aspects of the present disclosure.

It is understood that the following disclosure provides many different embodiments, or examples, for implementing different features, apparatus and methods according to aspects disclosed herein. Specific examples are described below to simplify the present disclosure. These are, of course, merely examples and are in no way intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Exemplary processes which demonstrate the high complexity of interconnecting the individual operations of a multifunction integrated circuit and an energy source (whether the energy source is an energy generating device and/or an energy storage device) become readily apparent when examining the mechanical dimensions of micro- or nano-scale devices designed for substantially autonomous operation. Historically, integrated circuit feature dimensions (e.g., gate widths) of microelectronic, MEMS and other micro-scale devices have reduced in physical size from about 2.0 µm to today's envisioned 0.35 µm or smaller. For currently envisioned nanoelectronic, NEMS and other nano-scale devices, feature dimensions are predicted to be as small as about 2 nm, if not smaller.

However, for the purposes of the present disclosure, one may additionally or alternatively consider microelectronic and other micro-scale devices to have feature dimensions (other than or in addition to thickness) having an order of magnitude of about 1000 µm or smaller, whereas nanoelectronic and other nano-scale devices have similar feature dimensions having an order of magnitude of about 1000 nm or smaller. For example, the lateral dimensions of a microelectronic device feature may be about 500 µm, whereas the lateral dimensions of a nanoelectronic device feature may be about 500 nm.

Nonetheless, many aspects of the present disclosure are not limited to the exemplary definitions of scale described above. Moreover, aspects of the present disclosure may be applicable or readily adaptable to dimensional scales other than the scale employed in discussing such aspects. For example, aspects of micro-scale devices described or otherwise within the scope of the present disclosure may be applicable or readily adaptable to nano-scale devices and devices of other dimensional scale, and aspects of nano-scale devices described or otherwise within the scope of the present disclosure may be applicable or readily adaptable to micro-scale devices and devices of other dimensional scale.

The present disclosure introduces exemplary embodiments of solid state energy sources for providing operating power to integrated circuit devices. However, aspects of the present disclosure are applicable and/or readily adaptable to apparatus including energy sources integrated with other types of microelectronic devices. Such other devices may be or include, without limitation, micro-electro-mechanical (MEMS) devices, nano-electro-mechanical (NEMS) devices, nanotechnology devices, and/or other forms of silicon-based and other semiconductive electronic devices. These other embodiments, although not necessarily illustrated in the present disclosure, are well within the intent, spirit and scope of the present disclosure.

The existence of an integrated power source within an enclosed package, such as with a sensor, an integrated circuit and/or a wireless transmitter/receiver, may allow for vast improvements in the deployment of sensor-based microelectronic devices, and possibly the reconnaissance of information acquisition and communications methods thereof. In embodiments within the scope of the present disclosure, such a wireless microelectronic device may be employed in a mobile application, such as to monitor movements of cattle and/or other domesticated or feral animals.

For example, embodiments within the scope of the present disclosure may provide means for preventing cattle from crossing fences or other boundaries, or from straying into areas where they are not intended. Such means may include a microelectronic device attached to an animal, wherein the device may include sensors and possibly utilize a geographic database and/or communications protocol to wirelessly transmit the identity and/or location of the animal to a static "fence-post" unit, which may relay proximity values back to the device. At fixed (though possibly arbitrary) proximity intervals, the device may wirelessly actuate a mechanism for diverting the motion of the animal beyond a predetermined boundary. However, such a device might not be feasible in a rural setting without utilizing an integrated power supply and wireless transmission of data.

According to aspects of another embodiment of the present disclosure, a similar microelectronic device may be utilized in a static or quasi-mobile environment, such as within a hospital room. For example, electro-cardio-gram (ECG) devices typically employ electrical sensors to monitor heart rates and waveforms. Microelectronic devices can be used to sense these cardiovascular oscillations and wirelessly transmit them back to a peripheral unit for aggregation and processing. The peripheral unit may transmit a time-stamp signal to synchronize a plurality of wireless devices that are collectively utilized to constructively and cohesively sense the heart waveform. These devices, having integrated power sources, need not be linked through a plurality of wires to a power unit, which may greatly reduce the set-up time necessary to wire a patient prior to the performing the ECG procedure, and may also reduce the unpleasant psychological effect of having a plurality of wires connected to a patient.

Referring to FIG. 1A, illustrated is a sectional view of at least a portion of one embodiment of an apparatus 100 in an intermediate stage of manufacture according to aspects of the present disclosure. The apparatus 100 includes an electrode 110 coupled to a frame 120. The electrode 110 may comprise aluminum, copper, gold, and/or other electrically conductive materials, and may be secured to the frame 120 by adhesive, bonding, brazing, clamps and/or other mechanical fasteners, and/or other means. The electrode 110 may have a thickness ranging between about 2 μm and about 20 μm. However, other thicknesses are also within the scope of the present disclosure. For example, in an exemplary nano-scale embodiment, the thickness may range between about 10 nm and about 100 nm.

The frame 120 includes an opening 125 configured to received an energy device according to aspects of the present disclosure. The perimeter of the opening 125 may substantially or approximately correspond to a perimeter of a microelectronic device to be coupled to and at least partially powered by the energy device. The perimeter of the opening 125 may have a substantially square, rectangular, circular, elliptical, or other regular or irregular geometric shape having lateral dimensions ranging between about 7 nm and about 50 mm. For example, the lateral dimensions of the opening 125 may range between about 7 mm and about 9 mm in one implementation, while in another implementation the lateral dimensions of the opening 125 may range between about 1 mm and about 9 mm. In one implementation, the opening 125 has a substantially square shape having sides of about 1 mm.

The frame 120 may be formed by forming the opening 125 in a sheet or plate of frame material, which may comprise one or more ceramics, plastics, and/or other electrically insulating materials. Examples of the frame material include ceramic, fused silica, and/or silicon carbide, although other materials are also within the scope of the present disclosure. The frame 120 may have a thickness ranging between about 0.3 mm and about 0.8 mm, although other thicknesses are also within the scope of the present disclosure. For example, in an exemplary nano-scale embodiment, the thickness may range between about 1 nm and about 20 nm. The opening 125 may be one of a plurality of possibly similar openings formed in the frame material, and may be formed in the frame material by micromachining, laser machining, casting, molding, stamping or cutting, and/or or other processes. The frame 120 may also comprise more than one layer of materials, including electrically conductive and insulating materials, wherein the multiple layers may be joined in a vertical fashion by adhesive, bonding, welding, and/or other processes.

The electrode 110 may substantially cover an entire surface of the frame 120, including the opening formed by the opening 125. However, in another embodiment, the perimeter of the electrode 110 may more substantially correspond to the perimeter of the opening 125. The frame 120 may also include a shallow recess or other indentation configured to receive the electrode 110. For example, the electrode 110 may be coupled to the frame 120 by press-fitting or otherwise forming an interference or friction engagement between the perimeter of the electrode 110 and the perimeter of the shallow indentation in the frame 120.

Figure 1B:
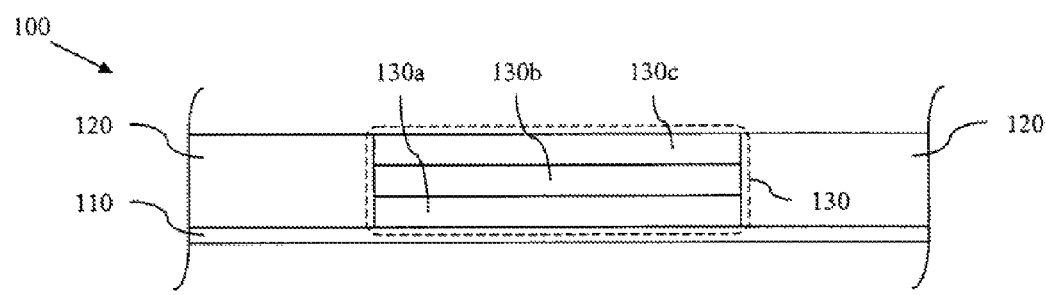
FIG. 1B is a sectional view of the apparatus shown in FIG. 1A in a subsequent stage of manufacture.

Referring to FIG. 1B, illustrated is a sectional view of the apparatus 100 shown in FIG. 1A in which an energy device 130 has been formed or otherwise positioned in the opening 125. An exemplary configuration of the energy stack 130 follows, although other configurations of the energy device 130 are also within the scope of the present disclosure.

In the illustrated embodiment, the energy device 130 comprises a separator layer 130b interposing electrode layers 130a, 130c. Each of the energy device layers 130a-c may individually comprise more than one layer, possibly of more than one material. The separator layer 130b may comprise manganese, titanium, vanadium, other solid electrolyte materials, and/or other materials. In one implementation, the separator layer 130b comprises lithium perchlorate ($LiClO_4$) mixed with polyvinylidene ($LiClO_4$-PVDF). The separator layer 130b may also or alternatively comprise a lithium salt cross-linked with a polyethyleneoxide.

The electrode layers 130a, 130c form an anode and a cathode of the energy device 130. That is, the electrode layer 130a may be an anode of the energy device 130, and the electrode layer 130c may be a cathode of the energy device 130, or the electrode layer 130a may be a cathode of the energy device 130, and the electrode layer 130c may be an anode of the energy device 130. In either case, the cathode may comprise dioxide, disulfide, pentoxide, and/or other materials. The cathode may also be impregnated with p-type or n-type elemental and/or nano-technology impurities, such as to enhance cathode charging performance and conductivity, possibly depending on the doping scheme employed in the fabrication of the microelectronic device to be packaged with the energy device 130.

The anode may be or comprise a metal alloy film or foil that may be impregnated with lithium or lithium alloy impurities. The anode may also be impregnated with p-type or n-type elemental and/or nano-technology impurities to enhance anode charging performance and conductivity, possibly depending on the doping scheme employed in the fabrication of the microelectronic device to be packaged with the energy device 130. In one embodiment, the cathode may be doped with a first impurity type (e.g., n-type) while the anode may be doped with a second, opposite impurity type (e.g., p-type). Of course, the present disclosure is in no way limited to any particular doping scheme of the energy device 130 or the microelectronic device to be packaged with the energy device 130.

The energy device 130 may employ a lithium-manganese-dioxide chemistry, including those which are readily available commercially and/or otherwise understood by those skilled in the art. Another example of the energy device 130 chemistry may be lithium-titanium-disulfide (Li—$TiSO_2$) or lithium-vanadium-pentoxide (Li—$V_2O_5$). Also, as discussed above, the cathode and/or anode may be doped with impurities, such as those typically employed in a semiconductor doping scheme. In that regard, the order in which the cathode, anode and separator 130b are fabricated within the frame 120 may depend on the fabrication processes of the microelectronic device to be packaged with the energy device 130. For example, the cathode may be associated with (or fabricated concurrently with) an n-type semiconductor device substrate or layer and the anode may be similarly associated with a p-type semiconductor substrate or layer. The energy device 130 may have a thickness ranging between about 200 μm and about 1000 μm, although other thicknesses are also within the scope of the present disclosure. For example, the thickness of the energy device 130 may range between about 300 µm and about 750 µm, such as about 400 µm. Each of the individual layers forming the energy device layers 130a-c may have a thickness ranging between about 25 µm and about 100 µm. In an exemplary nano-scale implementation, the thickness of the energy device 130 may range between about 1 nm and about 20 nm, such as where the thickness of each of the energy device layers 130a-c is substantially less than about 10 nm.

The anode may be formed by slicing a rolled lithium foil (possibly comprising battery grade, 99.8% pure lithium) into ingots to approximately 40 µm in length. The anode may also be alloyed with such metals as aluminum, manganese, and/or copper.

A polymer matrix used by both the separator and cathode material (e.g., layers 130b and 130a, respectively) may be formed by emulsifying polymer resin pellets, possibly in combination with a plasticizer. The polymer matrix may comprise polyacrylonitrile (PAN), polyvinyliden fluoride (PVdF) and/or polyvinyl sulfone (PVS), and the plasticizer may comprise dibutyl phthalate (DBP). Additionally, the polymer matrix may also comprise one or more polymer additives, possibly including nano-technology derived additives, which may be formulated to enhance a specific operational or performance characteristic. The polymer matrix and plasticizer may be emulsified in acetonitrile at about 60° C. in a reactor vessel equipped with a nitrogen inlet, a reflux condenser, and a stirring mechanism. The resulting viscous solution may then be cast into a polymer substrate to yield a film thickness ranging between about 30 µm and about 100 µm. The cast polymer membrane film may then be dried, such as in an oven, possibly at a temperature of about 80° C., which may at least partially remove the acetonitrile casting agent. After being allowed to dry, the originally highly-viscous membrane may be a translucent, flexible polymer membrane that also contains a high-temperature plasticized structure for rigidity.

In one implementation, electrolyte components possibly consisting of Ethylenecarbonate-EC, Propylyenecarbonate (PC), and Lithium Perchlorate (LiClO$_4$), mixed in an exemplary ratio of approximately 52/41/7 by weight, respectively, may be used in the preparation of the polymer electrolyte film as described in the above-mentioned emulsification process. For example, the electrolyte solution may be heated, possibly to a temperature of about 60° C., and the polymer film may be placed into the heated electrolyte solution, possibly for a period of up to 8 hours, to allow the electrolyte salt to link to the polymer structure. When the polymer film is removed from the electrolyte solution, it may be cooled to room temperature, which may allow additional electrolyte and polymer cross linking. The resulting solid state electrolyte separator membrane may then be cut to a desirable width and length to complete the separator layer 130b.

A similar process may be employed to form the cathode. However, such a polymer film employed to form the cathode may have a thickness ranging between about 300 µm and about 750 µm. Possibly employing the same type of reactor agent vessel with stirring mechanism, the polymer emulsion with plasticizer agent may be mixed with an electrochemical grade of LiMn$_x$O$_y$ spinel (FMC-Lithium) and a Super-P carbon such as Vulcan XC-72 (Cabot). For example, a mixture of polyethylene oxide containing high-temperature plasticizers, LiMnO$_2$ spinel (FMC-Lithium) and Super-P carbon (Vulcan-XC-72 Cabot) may be used in a ratio of approximately 55/42/3 by weight, respectively. The resulting polymer film may then be cut to a desirable width and length to form the cathode.

The energy device layers 130a-c may be formed or otherwise positioned in the frame 130 by pressing the individual or stacked layers into the opening 125. The energy device layers 130a-c may be cut-to-size prior to positioning in the opening 125, or may be trimmed after, or as a result of, their installation into the opening. In one embodiment, the energy device layers 130a-c may be individually or collectively compressed during or after their installation into the opening 125. For example, the energy device layers 130a-c may be subjected to a compression force ranging between about 10 psi (69 kPa) and about 200 psi (1379 kPa). In one embodiment, the compression force ranges between about 30 psi (207 kPa) and about 50 psi (349 kPa), such as about 40 psi (279 kPa). The energy device layers 130a-c may be compressed until a desired thickness is achieved. Alternatively, or additionally, the energy device layers 130a-c may be compressed until a desired output current is achieved from a given voltage.

Figure 1C:
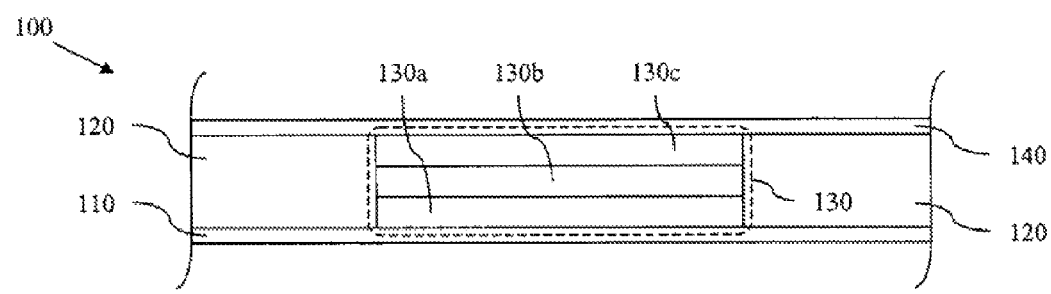
FIG. 1C is a sectional view of the apparatus shown in FIG. 1B in a subsequent stage of manufacture.

Referring to FIG. 1C, illustrated is a sectional view of the apparatus 100 shown in FIG. 1B in which an additional electrode 140 has been coupled to the frame 120 and/or the energy device 130. Consequently, the energy device 130 may be sandwiched between and possibly directly contact each of the electrodes 110, 140. The electrode 140 may be substantially the same as the electrode 110, and may be secured to the frame 120 and/or the energy device 130 in substantially the same manner, or via one of the other securing means described above regarding the attachment of the electrode 110 to the frame 120. The compression process described above may be performed after the electrode 140 has been secured to the frame 120 and/or the energy device 130, either in addition to or in the alternative to performing the compression process after the energy device 130 is formed in the frame 120.

The above-described manufacturing process for fabricating the apparatus 100 may also include verifying a maximum relative flatness and/or parallelism of the electrodes 110, 140. For example, the compression process described above may be performed sufficiently to achieve maximum flatness and/or minimum variation in parallelism of the electrodes 110, 140 of about 5 µm or less.

Figure 2A:
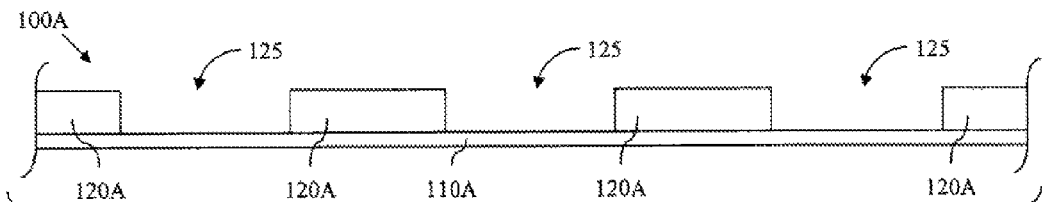
FIG. 2A is a sectional view of at least a portion of an embodiment of apparatus in an intermediate stage of manufacture according to aspects of the present disclosure.

Referring to FIG. 2A, illustrated is a sectional view of at least a portion of an embodiment of the apparatus 100 shown in FIG. 1A, herein designated by numeral reference 100A. The apparatus 100A is substantially similar to the apparatus 100 shown in FIG. 1A, although the apparatus 100A includes multiple instances of the frame 120, the energy device 130, and the electrodes 110, 140.

In the manufacturing stage illustrated in FIG. 2A, a sheet or plate of frame material 120A having openings 125 formed therein is secured to an electrode sheet 110A The frame material 120A and electrode sheet 110A may each be substantially similar in composition and manufacture to the frame 120 and electrode 110, respectively, shown in FIGS. 1A-1C. The electrode sheet 110A and the frame material 120A may also be secured to one another in a manner similar to the attachment of the frame 120 and the electrode 110 discussed above. The electrode sheet 110A may comprise a single continuous sheet or more than one sheet each corresponding to one or more of the openings 125.

Figure 2B:
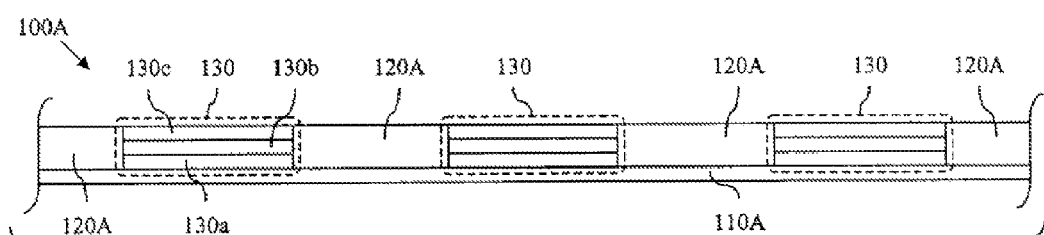
FIG. 2B is a sectional view of the apparatus shown in FIG. 2A in a subsequent stage of manufacture.

Referring to FIG. 2B, illustrated is a sectional view of the apparatus 100A shown in FIG. 2A in which an energy device 130 has been formed in each of the openings 125 in the frame material 120A. Each of the energy devices 130 shown in FIG. 2B may be substantially similar to the energy device 130 shown in FIGS. 1B, 1C. Once formed in the openings 125, the energy devices 130 may be individually or collectively compressed, such as by the compression processes described above.

The sequence by which the energy devices 130 are assembled in the openings 125 is not limited within the scope of the present disclosure. For example, a first energy device layer 130a may be formed in a corresponding opening 125, a second energy device layer 130b may then be formed in the opening 125, and a third energy device layer 130c may be formed in the opening 125, then this process may be repeated for each remaining opening 125, individually. Alternatively, the first energy device layer 130a may be formed in each of the openings 125, then the second energy device layer 130b may be formed in each of the openings 125, and then the third energy device layer 130c maybe formed in each of the openings 125. In such an embodiment, a sheet of first energy device layer material may be dispensed as a liquid into the frame, or as a solid sheet placed over the frame material 120A and punched, pressed or otherwise positioned in each of the openings 125, such as by a die or roller, and a similar process may be repeated for each of the remaining energy device layers.

Each of the layers forming an energy device 130 (e.g., layers 130a-c) may alternatively be pre-assembled to one another to form an energy device layer stack. Thereafter, the layer stack may be formed in each of the openings 125 one at a time, or the layer stack may be formed in each of the openings 125 substantially simultaneously. For example, a roller or die press having bosses substantially corresponding to the shape and position of the openings 125 may be employed to position portions of the layer stack into corresponding openings 125.

Figure 2C:
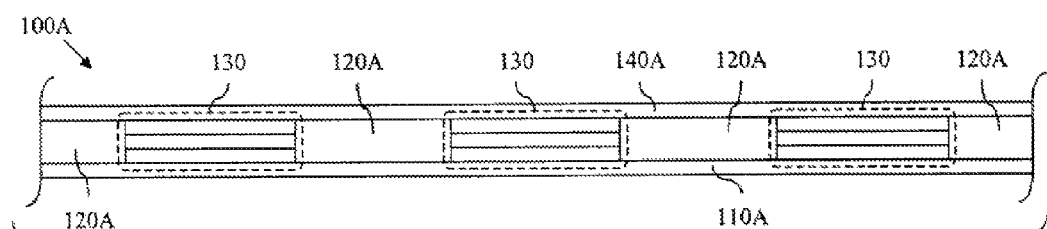
FIG. 2C is a sectional view of the apparatus shown in FIG. 2B in a subsequent stage of manufacture.

Referring to FIG. 2C, illustrated is a sectional view of the apparatus 100A shown in FIG. 2B in which an additional electrode sheet 140A has been secured to the frame material 120A and/or each of the energy devices 130. The electrode sheet 140A may be substantially similar in composition and manufacture to the electrode 110 shown in FIGS. 1A-1C. The electrode sheet 140A may also be secured to the frame material 120A and/or the energy devices 130 in a manner similar to the attachment of the electrode 140 to the frame 120 discussed above. The electrode sheet 140A may comprise one continuous sheet or more than one sheet each corresponding to one or more of the openings 125. The compression process described above may also be performed after the electrode sheet 140A has been secured to the frame material 120A and/or the energy devices 130, either in addition to or in the alternative to performing the compression process after the energy devices 130 are formed in the openings 125.

At the manufacturing stage shown in FIG. 2C, the apparatus 100A may be substantially configured to provide energy to one or more devices to be packaged with the apparatus 100A. Portions of the electrode sheets 110A, 140A may be removed to separate one or more of the energy devices from one another. For example, two or more adjacent energy devices 130 may remain interconnected by portions of one or both of the electrode sheets 110A, 140A and/or frame material 120, such as where the energy requirements for a particular device packaged therewith are greater than the capacity of each individual energy device 130. Such an embodiment may be advantageous when a standard energy device 130 may be desired. However, in such embodiments where adjacent energy devices are interconnected by one or both of the electrode sheets 110A, 140A and/or frame material 120, the layers employed as anode and cathode layers in some of the energy devices 130 may need to be reversed.

Figure 2D:
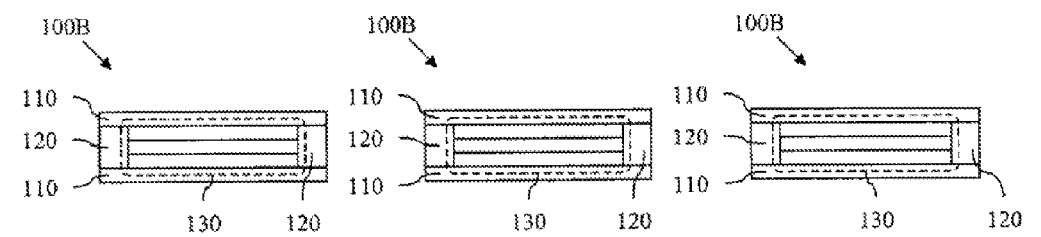
FIG. 2D is a sectional view of the apparatus shown in FIG. 2C in a subsequent stage of manufacture.

Referring to FIG. 2D, illustrated is a sectional view of the apparatus 200 shown in FIG. 2C in which individual apparatus 100B have been formed from the apparatus 100A by dicing or otherwise removing portions of the electrode sheets 110A, 140A and/or frame material 120A. Each of the apparatus 100B may be substantially similar to the apparatus 100 shown in FIG. 1C. Two or more of the apparatus 100B may also be stacked in a single package, such as to provide additional energy capacity. However, in such embodiments, one or both of the electrode sheets 110A, 140A interposing two vertically stacked energy devices 130 may be removed.

Figure 3:
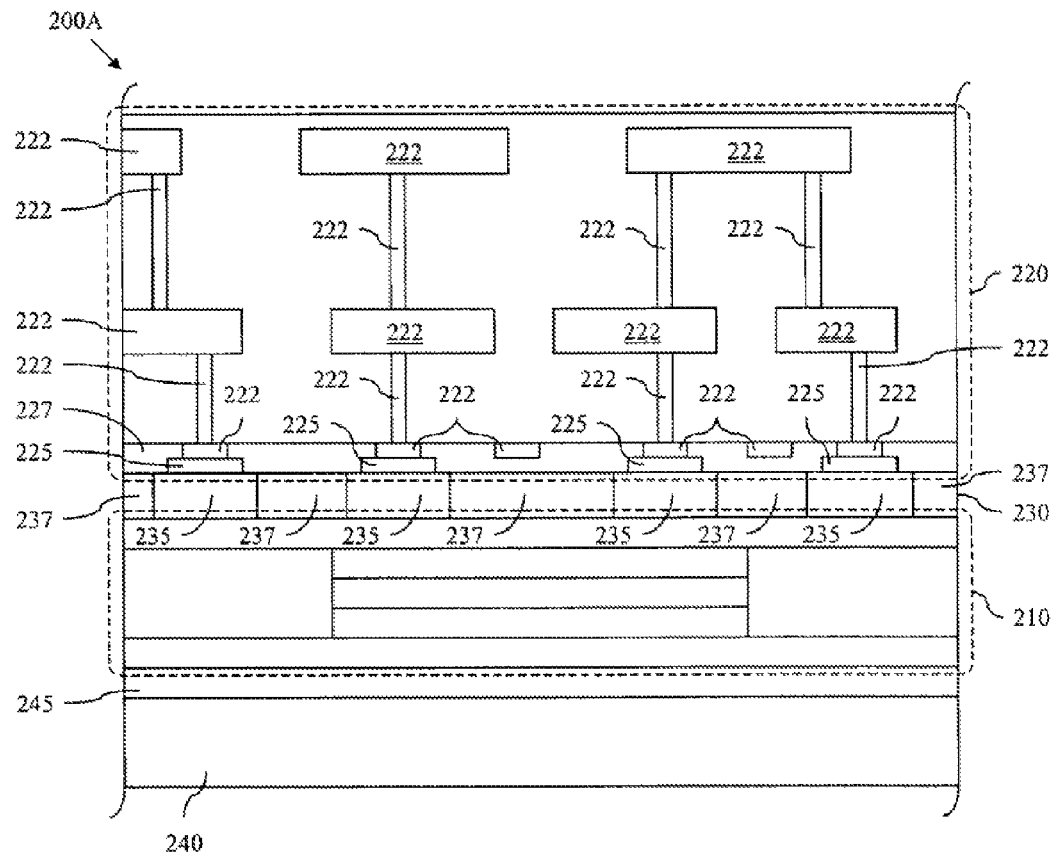
FIG. 3 is a sectional view of at least a portion of an embodiment of apparatus according to aspects of the present disclosure.

Referring to FIG. 3, illustrated is a sectional view of at least a portion of one embodiment of an apparatus 200A according to aspects of the present disclosure. The apparatus 200A includes an energy cell 210 that may be substantially similar to the apparatus 100 shown in FIG. 1C, one of the apparatus 100B shown in FIG. 2D, and/or one of the energy devices 130 shown in FIG. 1B, 1C, or 2B-2D. The apparatus 200A also includes a device 220 to be at least partially powered by the energy cell 210. An interface layer 230 may comprise or at least partially provide one or more interfaces between the energy cell 210 and the device 220.

Although not illustrated, aspects of the present disclosure are also applicable and/or readily adaptable to other embodiments of the apparatus 200A which may include more than one energy cell 210, more than one device 220, and/or more than one interface layer 230. In such embodiments, the multiple energy cells 210 may or may not be substantially identical, the multiple devices 220 may or may not be substantially identical, and the multiple interface layers 230 may or may not be substantially identical.

The device 220 may be or comprise one or more integrated circuit devices, micro-electromechanical (MEMS) devices, nano-electromechanical (NEMS) and other nano-scale devices, organic electronic devices, other microelectronic devices, sensor devices, RFID devices, and/or a variety of combinations thereof. The device 220 may additionally or alternatively comprise a plurality of transistors, capacitors, inductors, analog signal processing devices, memory devices, logic devices, and/or other microelectronic devices interconnected by, for example, a plurality of electrically conductive vias, landing pads, and/or other forms of electrically conductive interconnects. Several of such devices and interconnects are collectively designated by reference numeral 222 in FIG. 3.

Although not limited as with within the scope of the present disclosure, the device 220 may be any device having electrically conductive contacts 225 configured for connection with an energy source. Such devices may be formed on and/or in a substrate 227 substantially comprising silicon, or a variety of other semiconductor materials, and/or a variety of other substrate suitable materials. In one embodiment, such a device having such a substrate 227 may include electrically conductive contacts, vias or other electrically conductive members 225 extending at least partially into or through the substrate 227 to a bottom or other surface for interconnection with the energy cell 210 via the interface layer 230. The conductive members 225 may electrically couple the energy cell 210, at least indirectly, with one or more of the individual devices which compose the device 220. The device 220 may also or alternatively include or otherwise be electrically interconnected by wire bonds to the energy cell 210. The device 220 may also or alternatively be electrically connected to the energy cell 210 via the interface layer 230 by flip-chip mounting or other processes employing stud bumps, solder balls, and/or electrically conductive epoxy or other adhesives.

The interface layer 230 may comprise one or more layers of various electrically conductive and/or electrically insulating materials. For example, in the embodiment illustrated in FIG. 3A, the interface layer 230 comprises a number of electrically conductive members 235 configured to interconnect contacts 225 of the device 220 with the energy cell 210. The electrically conductive members 235 may comprise aluminum, copper, gold, tungsten, conductive epoxy and other electrically conductive adhesives, solder, and/or other materials. Gaps 237 between the conductive members 235 may substantially comprise air, inert gases (e.g., argon), a vacuum, and/or dielectric materials such as silicon dioxide, fluorinated silicate glass (FSG), SILK (a product of Dow Chemical), or Black Diamond (a product of Applied Materials).

The interface layer 230 may also be or at least partially comprise a flag, paddle, central support member or other portion of a lead frame employed to interconnect power and/or data contacts of the device 220 with surrounding circuitry. However, such lead frame portion may alternatively be positioned elsewhere besides interposing the energy cell 210 and the device 220. For example, the energy cell 210 may interpose and possibly contact both the lead frame and the device 220, or the device 220 may interpose and possibly contact both the lead frame and the energy cell 210. In such embodiments, the contact between the energy cell 210, the device 220 and/or the lead frame may be through one or more intermediary layers, such as may be employed to improve adhesion, electrical conductivity and/or electrical isolation between the "contacting" components.

The apparatus 200A may also include a manufacturing process handling or transport substrate or other structure coupled to the energy cell 210 (hereafter referred to as the handle 240), such as in the illustrated example. Among other possible purposes, the handle 240 may assist in the handling of the apparatus 200A during and/or after manufacturing. However, the apparatus 200A may not include the handle 240. Nonetheless, when the handle 240 is employed, it may be removed and possibly discarded during or after manufacturing. When employed, the handle 240 may also be positioned relative to the other features of the apparatus 200A in locations other than as shown in FIG. 3A. For example, the handle 240 may be coupled to the device 220 rather than to the energy cell 210. The handle 240 may also be employed during the manufacture and/or assembly of the feature to which it is coupled. For example, the handle 240 may be integral to or otherwise coupled to the energy cell 210 or the device 220 during the manufacture and/or assembly thereof.

The apparatus 200A may also include a sacrificial or release layer 245 interposing the handle 240 and the remainder of the apparatus 200A. The sacrificial layer 245 may comprise silicon dioxide, polysilicon, and/or other materials easily removable by a diluted hydrofluoric acid etch and/or other conventional or future-developed sacrificial layer removal processes. The sacrificial layer 245 may also or alternatively comprise an adhesive which may permanently or temporarily bond the handle 240 to the energy cell 210 or other portion of the apparatus 200A. Clamps and/or other mechanical fasteners may be employed in addition to or in the alternative to the sacrificial layer 245.

The apparatus 200A may also include or be encapsulated in one or more insulating layers formed around a substantial portion of the apparatus 200A, such as to protect the apparatus 200A from potentially hazardous mechanical and environmental elements which may cause damage or destruction. Such encapsulating or insulating layer(s) may comprise polyphenolene sulfide and/or a variety of another non-conductive encapsulant materials Referring to FIG. 4A, illustrated is an exploded perspective view of at least a portion of an embodiment of an apparatus 300 according to aspects of the present disclosure. The portion of the apparatus 300 shown in FIG. 4A includes an energy cell 310 having an energy device 130 formed or otherwise positioned in a frame 120, as well as electrodes 110, 140. The energy cell 310 may be substantially similar to the apparatus 100 shown in FIG. 1C and/or the apparatus 100B shown in FIG. 2D. For the sake of clarity, a portion of the energy device 130 and the frame 120 have been removed and the electrodes 110, 140 are shown in a disassembled configuration.

The frame 120 may include an electrically conductive via or other conductive member 320 extending through the frame 120. The perimeter of the electrode 140 may also include a scallop, recess, indentation, or otherwise defined profile 325 configured such that the electrode 140 does not electrically contact the conductive member 320 when the electrode 140 is coupled to the frame 120, such as in the assembled configuration of the energy cell 310 shown in the perspective view in FIG. 4B.

Figure 4C:
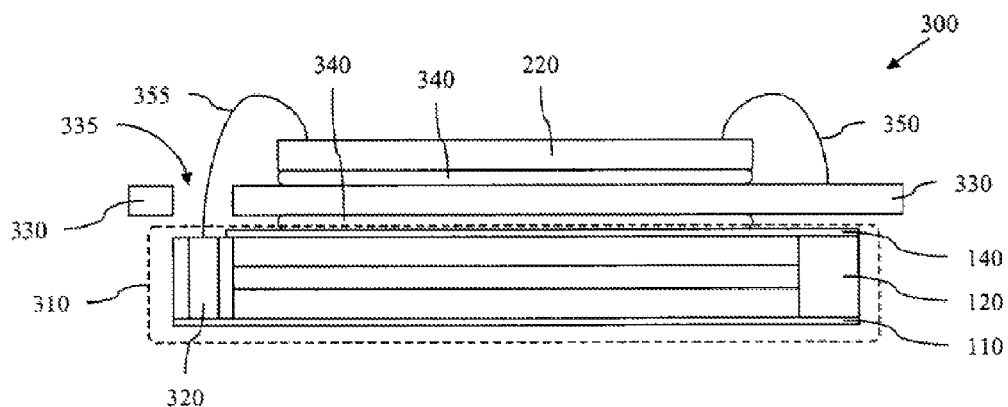
FIG. 4C is a sectional view of the apparatus shown in FIG. 4A.
Figure 4A:
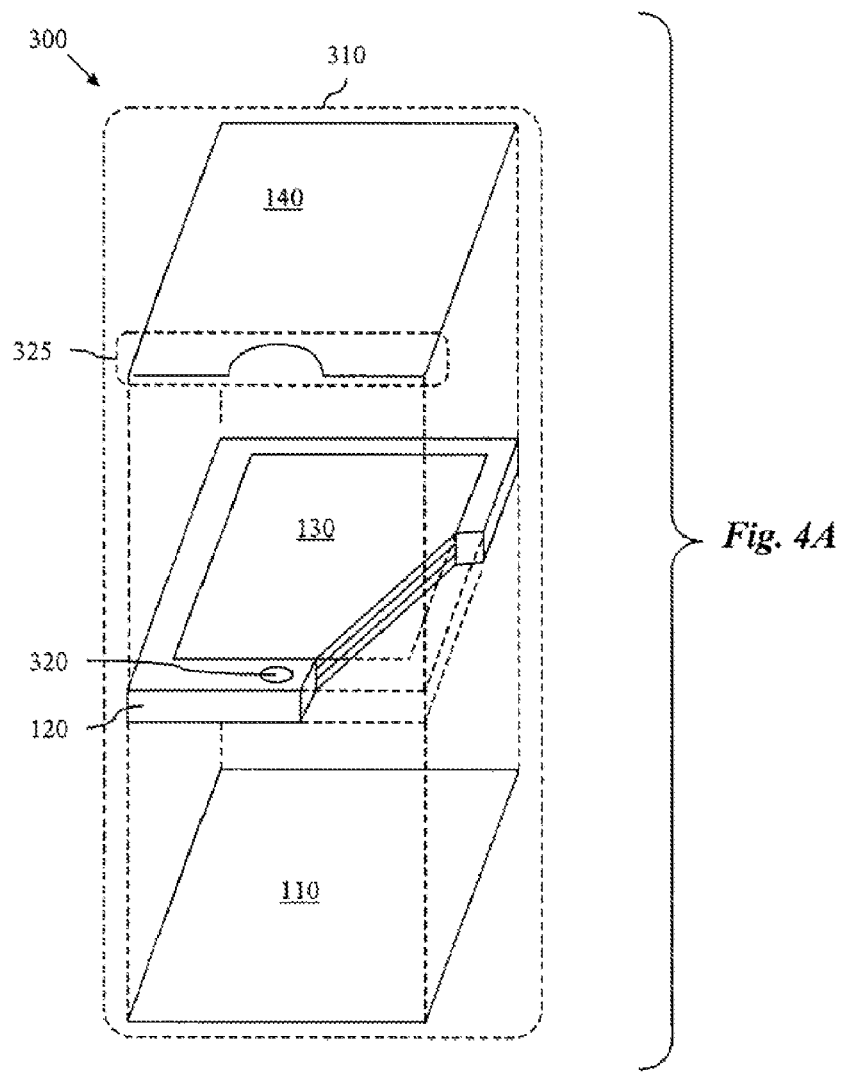
FIG. 4A is an exploded perspective view of at least a portion of an embodiment of apparatus according to aspects of the present disclosure.
Figure 4B:
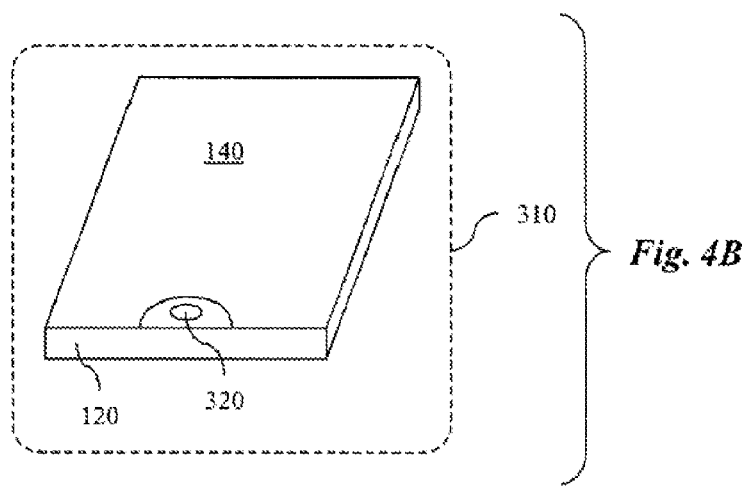
FIG. 4B is another view of the apparatus shown in FIG. 4A.

Referring to FIG. 4C, illustrated is a sectional view of the apparatus 300 shown in FIG. 4A in which the energy cell 310 and a device 220 to be packaged with the energy cell 310 have been coupled via an interposing member 330. The device 220 may be substantially similar to the device 220 discussed above with reference to FIG. 3.

The interposing member 330 may be or comprise at least a portion of a paddle, flag, and/or other portion of a lead frame. In one embodiment, such a lead frame may be a conventional or future-developed lead frame assembly having an industry-standard geometry and composition. The lead frame assembly may include a paddle, flag, or other central support member and a plurality of formable, flexible metal leads that extend radially around the periphery of the central support member to a plurality of "J" style leads or other end use, packaging style appropriate pin connectors. In one embodiment, the lead frame assembly may include 28 pairs of leads and connectors, such as the Olin Brass C194 distributed by A.J. Oster Company of Warwick, R.I. The central support member may also include a conductive coating on one or both major surfaces thereof to increase their electrical conductivity. Although not limited by the scope of the present disclosure, such a conductive coating may be or comprise a graphite based coating having a thickness of about 25 µm, such as Electrodag® EB-012 distributed by the Acheson Colloids Company of Port Huron, Mich. The conductive coating may be applied by lamination or conventional or future-developed thin-film deposition processes, and may be cured by exposure to heat or air, for example.

The energy cell 310 and the device 220 may each be coupled to the interposing member 330 via one or more adhesive layers 340. The adhesive layers 340 may each comprise an electrically and/or thermally conductive elastic dry film and/or a silicone elastomer, possibly including a silver pigmentation. The energy cell 310 and the device 220 may also or alternatively be welded to the interposing member 330 by laser welding and/or other conventional processes.

The apparatus 300 may also include a plurality of wire bonds 350 or other type of conventional or future-developed interconnection media, such as those comprising carbon nanotubes or polyacetalynes. Each wire bond 350 couples a lead or other portion of the interposing member 330 to corresponding bond pads or other contacts formed on and/or in the device 220. The wire bonds 350 may be employed for power supply voltages, regulated power conditioned and battery charging voltages, analog conditioning and sensing signals, micro-electromechanical sensing and activation signals, digital input/output signals, such as chip select, addressing or data signals, and/or other signals between the device 220 and circuitry connected to the interposing member 330.

An additional wire bond 355 may couple one of the bond pads or other contacts formed on and/or in the device 220 to the conductive member 320. The wire bond 355 may be substantially similar in composition, manufacture, and assembly to the wire bond 350. The wire bond 355 may extend through an opening, gap, or other aperture 335 in the interposing member 330, or may be routed around the perimeter of the interposing member 330. The wire bonds 350, 355 may comprise gold and/or other conductive materials, and may be formed and assembled by conventional and/or future-developed processes.

Because the conductive member 320 contacts or is electrically connected to the electrode 110 of the energy device 310, the device 220 may be connected to the electrode 110 via the wire bond 355. The device 220 may also be connected to the electrode 140 of the energy device 310 by an additional wire bond or other similarly described 350 connection means discussed above. However, in the embodiment shown in FIG. 4C, the device 220 is connected to the electrode 140 via the interposing member 330 and the adhesive layers 340. For example, a power supply contact for the device 220 may be on a surface of the device 220 that is contacted by one of the adhesive layers 340 (e.g., the lower surface in the orientation shown in FIG. 4C), such that the adhesive layers 340 and the interposing member 330 collective connect the power supply contact of the device 220 to the electrode 140 of the energy device 310, wherein the electrode 140 may be an anode of the energy device 310, or may be connected to the anode of the energy device 310. Consequently, the cathode of the energy device 310, which may be the electrode 110, or which may be connected to the electrode 110, may be connected to a ground potential contact for the device 220 through the conductive member 320 and the wire bond 355.

Aspects of the apparatus 300 are applicable and/or readily adaptable to embodiments employing energy cells other than the energy cell 310, and also to embodiments employing devices other than the device 220 described herein. Some embodiments of the apparatus 300 may also include more than one energy cell, each of which may be substantially similar to or different than the energy cell 310, and may also include more than one device, each of which may be substantially similar to or different than the device 220. The apparatus 300 shown in FIG. 4C may also exclude one or both of the electrodes 110, 140. For example, the interposing member 330 may be coupled directly to the topmost (relative to the orientation shown in FIG. 4A) or otherwise exposed layer of the energy device 130, possibly through one of the adhesive layers 340 and/or other coupling means other than the electrode 140. Similarly, the bottommost layer of the energy device 130 (relative to the orientation shown in FIG. 4B) may be connected to the conductive member 320 directly or by one or more elements, features, components, or members other than the electrode 110.

Referring to FIG. 5A, illustrated is a top view of at least a portion of an embodiment of the frame 120 discussed above and designated herein by the reference numeral 500. The frame 500 is substantially similar in composition and manufacture to the frame 120 discussed above, and includes an opening 502 configured to receive an energy device stack, such as that comprising the energy device layers 130*a-c* described above.

The frame 500 also includes traces, metallization features, and/or other electrically conductive members herein referred to as conductive members 510 (the frame 120 described above may include similar conductive members 510). The electrically conductive members 510 may comprise aluminum, copper, gold, tungsten, and/or other conductive materials, and may be formed by selective deposition or bonding, brazing, blanket deposition following by one or more patterning processes, and/or other processes. In one embodiment, the electrically conductive members 510 may have a thickness ranging between about 50 µm and about 500 µm, although a variety of other thicknesses are also within the scope of the present disclosure.

The electrically conductive members 510 are illustrated as being recessed within the surfaces of the body 505 of the frame 500, such that the upper or outer surfaces or profiles of the electrically conductive members 510 may be substantially planar or recessed within the body surface in which the conductive members 510 are formed. In such an embodiment, the electrically conductive members 510 may be formed by forming recesses in the frame body 505, such as by etching, laser machining, and/or other processes, and subsequently filling the recesses with conductive material, possibly followed by one or more chemical-mechanical polishing or planarizing processes and/or other planarizing processes. In other embodiments, the electrically conductive members 510 may be only partially recessed within the surfaces of the frame body 505, thereby at least partially protruding from the surfaces of the body 505. In other embodiments, the surfaces of the body 505 may be substantially planar and the electrically conductive members 510 may merely be formed thereon.

The electrically conductive members 510 include a electrically conductive member 510A which comprises one or more perimeter portions substantially surrounding the opening 502 or otherwise configured to contact an electrode component coupled to the frame 500 and/or an outermost energy device layer located in the opening 502 adjacent the electrically conductive member 510A. The electrically conductive member 510A also includes one or more extension portions 511A extending between the perimeter portions thereof and a spanning conductive member 510C shown more clearly in FIG. 5B.

The electrically conductive members 510 also include a conductive member 510B which comprises one or more perimeter portions substantially surrounding the opening 502 but electrically isolated from the electrically conductive member 510A, such as by a gap 515 comprising air, inert gases, other dielectric materials, or a vacuum. The conductive member 510B may substantially or at least partially conform to the electrically conductive member 510A, although the conductive member 510B may be offset radially outward from the conductive member 510A. Ends 512 of the conductive member 510B may terminate on opposing sides of the extension portion 511A of the electrically conductive member 510A. The conductive member 510B may also include one or more extension portions 511B extending between the perimeter portions thereof and an additional spanning conductive member 510D shown more clearly in FIG. 5D. The extension portions 511A, 511B of the electrically conductive members 510A, 510B may be located at opposite, possibly substantially parallel ends or sides of the frame 500, as shown in FIG. 5A, although in other embodiments the extension portions 511A, 511B of the electrically conductive members 510A, 510B may be located on adjacent, possibly perpendicular ends or sides of the frame 500.

Referring to FIG. 5B, illustrated is a left side view of the frame 500 shown in FIG. 5A. The spanning conductive member 510C includes one or more portions collectively or each individually spanning the thickness of the frame body 505, thereby connecting the extension portion 511A of the electrically conductive member 510A and an additional conductive member 510E shown more clearly in FIG. 5D.

Referring to FIG. 5C, illustrated is a right side view of the frame 500 shown in FIG. 5A. The spanning conductive member 510D includes one or more portions collectively or each individually spanning the thickness of the frame body 505, thereby connecting the extension portion 511B of the electrically conductive member 510B and an additional conductive member 510F shown more clearly in FIG. 5D.

Referring to FIG. 5D, illustrated is a bottom view of the frame 500 shown in FIG. 5A. The electrically conductive members 510 include conductive member 510F which comprises one or more perimeter portions substantially surrounding the opening 502 or otherwise configured to contact an electrode component coupled to the frame 500 and/or an outermost energy device layer located in the opening 502 adjacent the conductive member 510F. The conductive member 510F also includes one or more extension portions 511F extending between the perimeter portions thereof and the spanning conductive member 510D shown more clearly in FIG. 5C.

The electrically conductive members 510 also include conductive member 510E which comprises one or more perimeter portions substantially surrounding the opening 502 but electrically isolated from the conductive member 510F, such as by a gap 517 comprising air, inert gases, other dielectric materials, or a vacuum. The conductive member 510E may substantially or at least partially conform to the conductive member 510F, although the conductive member 510E may be offset radially outward from the conductive member 510F. Ends 514 of the conductive member 510E may terminate on opposing sides of the extension portion 511F of the conductive member 510F. The conductive member 510E may also include one or more extension portions 511E extending between the perimeter portions thereof and the spanning conductive member 510C shown more clearly in FIG. 5B. The extension portions 511E, 511F of the conductive members 510E, 510F may be located at opposite, possibly substantially parallel ends or sides of the frame 500, as shown in FIG. 5D, although in other embodiments the extension portions 511E, 511F of the conductive members 510E, 510F may be located on adjacent, possibly perpendicular ends or sides of the frame 500.

Although not illustrated, the spanning conductive member 510C may comprise more than one laterally offset member each spanning the left side of the frame body 505, although such a configuration may also require that the electrically conductive members 510A, 510E each comprise more than one extension portion extending from their respective perimeter portions. Similarly, the spanning electrically conductive member 510D may comprise more than one laterally offset member each spanning the right side of the frame body 505, although such a configuration may also require that the electrically conductive members 510B, 510F each comprise more than one extension portion 511B, 511F extending from their respective perimeter portions.

As in the embodiment shown in FIGS. 5A-5D, the patterns of the electrically conductive members 510A, 510F may be substantially identical or similar, or mirror images, depending upon the orientations employed for such a comparison. The patterns of the electrically conductive members 510B, 510E may be likewise similar, as well as the patterns of the conductive members 510C, 510D.

Figure 5E:
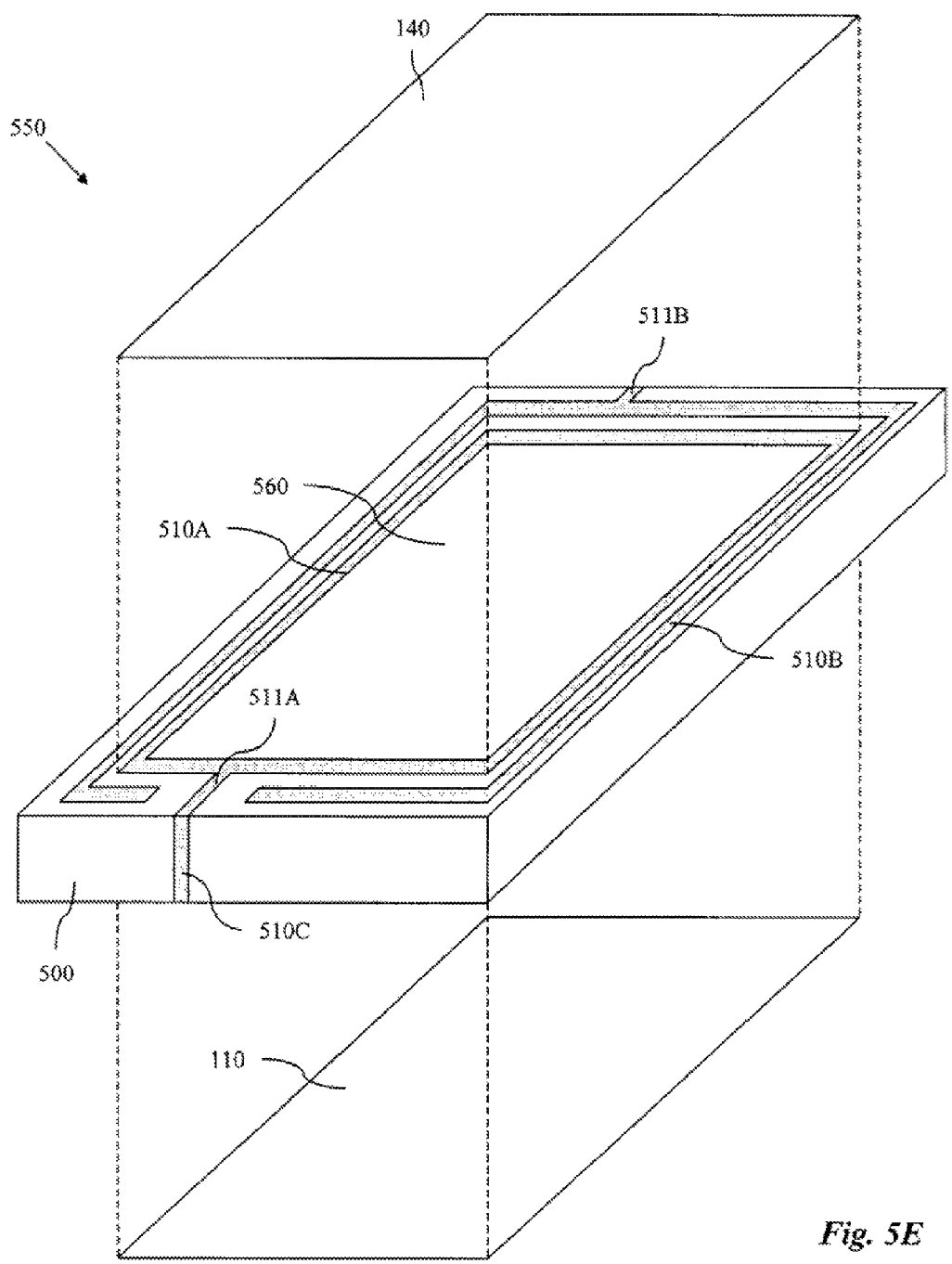
FIG. 5E is an exploded perspective view of the apparatus shown in FIG. 5A demonstrating a subsequent stage of manufacture according to aspects of the present disclosure.

Referring to FIG. 5E, illustrated is an exploded perspective view of at least a portion of an embodiment of an apparatus 550 according to aspects of the present disclosure. The apparatus 550 is one environment in which the frame 500 shown in FIGS. 5A-5D may be implemented. The portion of the apparatus 550 shown in FIG. 5E includes an energy cell 560 having an energy device (such as energy device 130 described above) formed or otherwise positioned in the frame 500, as well as electrodes 110, 140 on opposing sides of the energy device. The energy cell 560 may be substantially similar to the apparatus 100 shown in FIG. 1C and/or the apparatus 100B shown in FIG. 2D. By example, the electrodes 110, 140 may be coupled or otherwise secured to the frame 500 by Nd:YAG laser soldering or active brazing. However, for the sake of clarity, the electrodes 110, 140 are shown in a disassembled configuration in FIG. 5E.

The perimeter of the electrode 140 may substantially conform or otherwise correspond to the electrically conductive member 510A shown in FIG. 5A, or at least to the perimeter portions of the electrically conductive member 510A (e.g., excluding the extension portion 511A). Accordingly, upon assembly, the electrode 140 may electrically contact a substantial portion of the conductive member 510A and/or an electrode layer or other outermost layer of the energy cell 560. However, the perimeter of the electrode 140 may also be offset laterally inward relative to the electrically conductive member 510B shown in FIG. 5A, such that electrode 140 may be electrically isolated from the electrically conductive member 510B. Otherwise, the electrode 140 may substantially be as described above.

Similarly, the perimeter of the electrode 110 may substantially conform or otherwise correspond to the electrically conductive member 510F shown in FIG. 5D, or at least to the perimeter portion of the electrically conductive member 510F (e.g., excluding the extension portion 511F). Accordingly, upon assembly, the electrode 110 may electrically contact a substantial portion of the electrically conductive member 510F and/or an electrode layer or other outermost layer of the energy cell 560. However, the perimeter of the electrode 110 may also be offset laterally inward relative to the electrically conductive member 510E shown in FIG. 5D, such that electrode 110 may be electrically isolated from the electrically conductive member 510E. Otherwise, the electrode 110 may substantially be as described above.

Figure 5F:
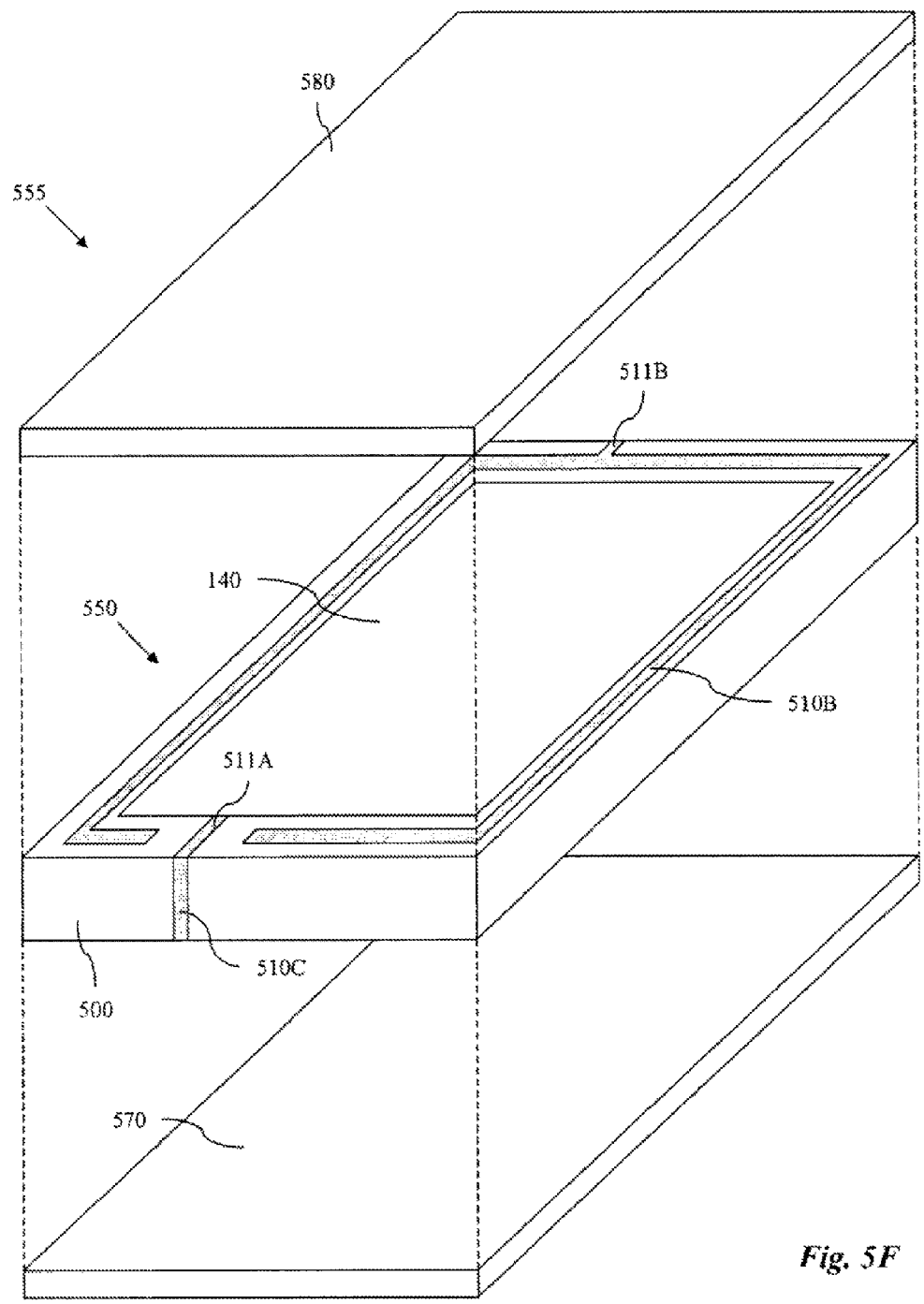
FIG. 5F is an exploded perspective view of the apparatus shown in FIG. 5E demonstrating a subsequent stage of manufacture according to aspects of the present disclosure.

Referring to FIG. 5F, illustrated is an exploded perspective view of at least a portion of an embodiment of an apparatus 555 according to aspects of the present disclosure. The apparatus 555 is one environment in which the apparatus 550 shown in FIG. 5E may be implemented. The portion of the apparatus 555 shown in FIG. 5F includes an embodiment of the apparatus 550, or another type of energy cell or energy storage device, as well as devices 570, 580 to be packaged on opposing sides of the apparatus 550. However, for the sake of clarity, the devices 570, 580 are shown in a disassembled configuration in FIG. 5F. The devices 570, 580 may be substantially similar to the devices 220 or other devices described above as being packaged with an energy device or cell. The apparatus 555 may also include only one of the devices 570, 580. In such embodiments, one or more of the electrodes 110, 140 shown in FIG. 5E, and/or one or more of the conductive members 510 shown in FIGS. 5A-5D, may be omitted. For example, if the device 580 is coupled to one side of the apparatus 550, but the apparatus 555 does not include a device coupled to the opposing side of the apparatus 550 (such as the device 570), the electrode 110 shown in FIG. 5E may be omitted.

Figure 5G:
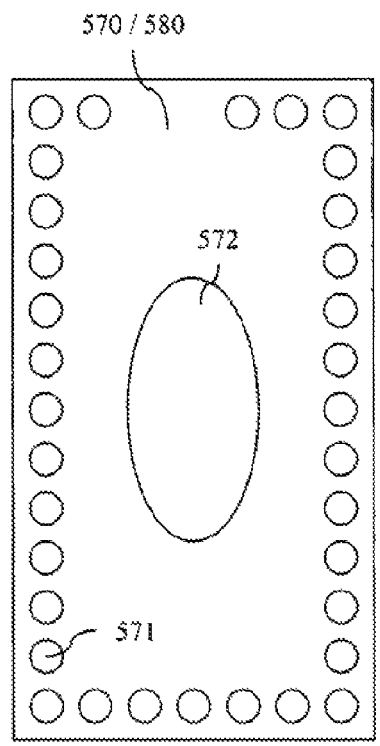
FIG. 5G is a bottom view of an at least a portion of one embodiment of an apparatus according to aspects of the present disclosure, which may be a portion of the apparatus shown in FIGS. 5A-5F.

Referring to FIG. 5G, illustrated is a bottom view of at least a portion of one embodiment of either of the devices 570 and 580 (designated in FIG. 5G as "570/580") that can be attached to either of the electrode elements 110 and 140 shown in FIG. 5F. On the outside perimeter of the device 570/580 (e.g., the outside perimeter of the device die), I/O contacts 571 may, for example, be constructed utilizing flip-chip evaporated Under Bump Metallization (UBM) and conductive adhesive stencil techniques. Within the center of the device 570/580 (e.g., the center of the device die), a large area single contact point 572 or a plurality of multiple contact points can similarly be formed utilizing similar techniques. For assembly of the device 570/580 to the assembled power source (e.g., apparatus 550 shown in FIG. 5E), the device 570/580 is flipped on top of the cell assembly 550 such that the I/O contacts 571 align with the metallized and electrically conductive member 510B or 510E. Contact for the large area contact points within the center of the die can be accomplished anywhere on the electrode element 110 or 140. A complimentary construction technique can be utilized for assembly of a second device 570/580 where its associated I/O contacts align with and contact the corresponding conductive member 510B or 510E and its associated center contact 572 aligns with and contacts the corresponding electrode element 110 or 140. By way of example, each of the three assembled devices, now consisting of an energy storage cell 550 layered between two devices 570/580, may be temporarily held together using an assembly tape such as Kapton® (I.E. DuPont) until an interposing, conductive adhesive can be cured, such as at about 150° C. for fifteen to thirty minutes.

Aspects of the apparatus 500, 550, 555 are applicable and/or readily adaptable to embodiments employing energy cells other than those shown in FIGS. 5A-5G, and also to embodiments employing devices other than the devices shown in FIGS. 5A-5G or otherwise described herein. Embodiments of the apparatus 500, 550, 555 may also include more than one energy cell, each of which may be substantially similar to or different than those shown and described herein, and may also include more than one device, each of which may be substantially similar to or different than the devices shown and described herein.

Figure 5H:
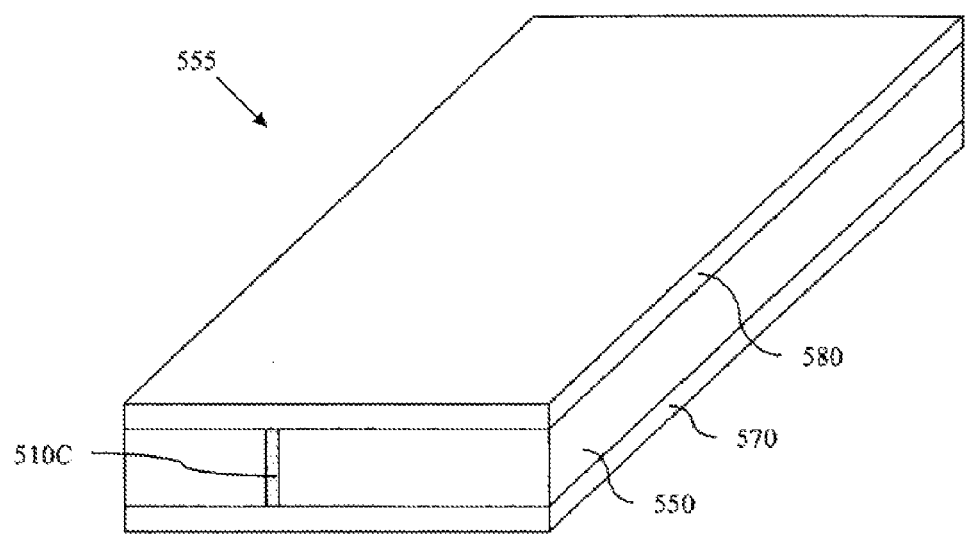
FIG. 5H is another perspective view of the apparatus shown in FIG. 5E.

Referring to FIG. 5H, illustrated is a perspective view of the apparatus 555 shown in FIG. 5F after the devices 570/580 have been assembled to opposing surfaces of the energy storage cell 550. In the illustrated example, the footprint of each of the devices 570/580 substantially conforms to the footprint of the energy storage cell 550, both in regard to shape and surface area. However, one or both of the devices 570/580 may alternatively have a footprint that differs in shape and/or surface area relative to the footprint of the cell 550, whether or larger or smaller.

Figure 6A:
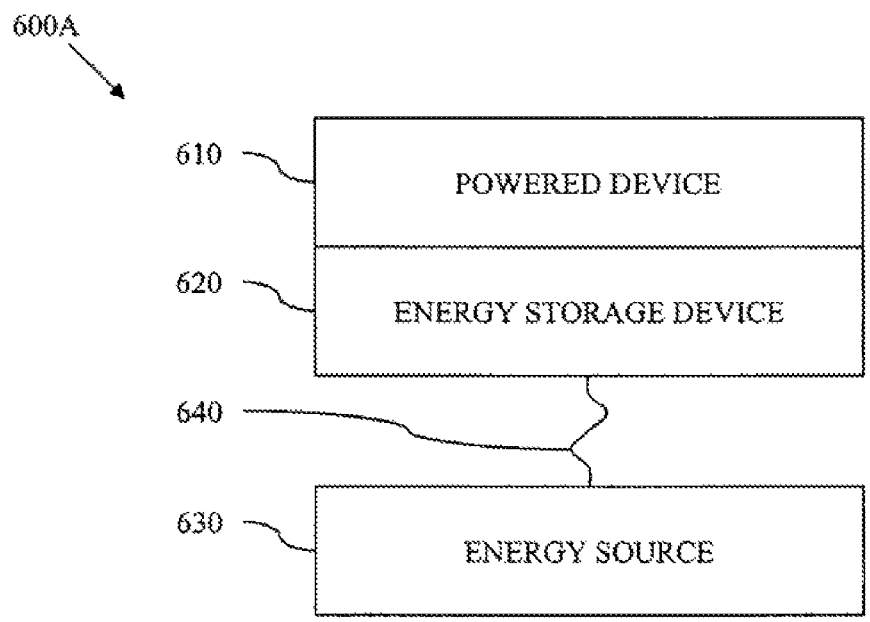
FIG. 6A is a schematic view of at least a portion of an embodiment of apparatus according to aspects of the present disclosure.

Referring to FIG. 6A, illustrated is a schematic view of at least a portion of an embodiment of an apparatus 600A according to aspects of the present disclosure. The apparatus 600A includes a device 610 packaged with and powered at least partially by an energy storage device 620 according to aspects of the present disclosure. The device 610 may be substantially similar to the device 220 described above, other devices described herein, and/or other devices within the scope of the present disclosure. The device 220 may also include more than one discrete device, die, or chip, or may itself be or comprise an apparatus substantially similar to the apparatus 600A.

The energy storage device 620 may be substantially similar to one or more of the energy devices or cells described above. However, rather than merely generating the energy provided to at least partially power the device 610, the energy storage device 620 is also electrically coupled to an energy source 630, such as by wires or other electrically conductive members 640, which may be configured to recharge the energy storage device 620.

The energy source 630 may be or include a nuclear battery, such as described in "The Daintiest Dynamos," IEEE Spectrum, September 2004, Amit Lal and James Blachard, the entirety of which is hereby incorporated by reference herein. The energy source 630 may additionally or alternatively be or include a MEMS based thin-film fuel cell, such as described in U.S. Pat. No. 6,638,654 to Jankowski, et al., the entirety of which is hereby incorporated by reference herein. The energy source 630 may additionally or alternatively be or include RF energy collectors similar to RFID Tag and Electronic Product Code (EPC) implementations, such as described in Technology Review, July/August 2004, pp 74, 75, Erika Joniets, Massachusetts Institute of Technology (MIT), the entirety of which is hereby incorporated by reference herein. The energy source 630 may additionally or alternatively be or include a single or plural configuration of photovoltaic cells, such as described in U.S. Pat. No. 6,613,598 to Middelman, et al., U.S. Pat. No. 6,580,026 to Koyanagi, et al., U.S. Pat. No. 6,538,194 to Koyanagi, et al., U.S. Pat. No. 6,479,745 to Yamanaka, et al., U.S. Pat. No. 6,469,243 to Yamanaka, et al., or U.S. Pat. No. 6,278,056 to Sugihara, et al. These patents, in their entirety, are hereby incorporated by reference herein. The energy source 630 may additionally or alternatively be or include one or more of: a radioactive generator, a ferro-electric or magnetic generator, a lead zirconate titanate (PZT) electricity generating ceramic device, or a MEMs based petro-chemical internal combustion engine with an electric generator, an elastomeric generator, or a piezoelectric generator, or other acoustic or mechanical vibration piezoelectric energy harvesters, among others.

Figure 6B:
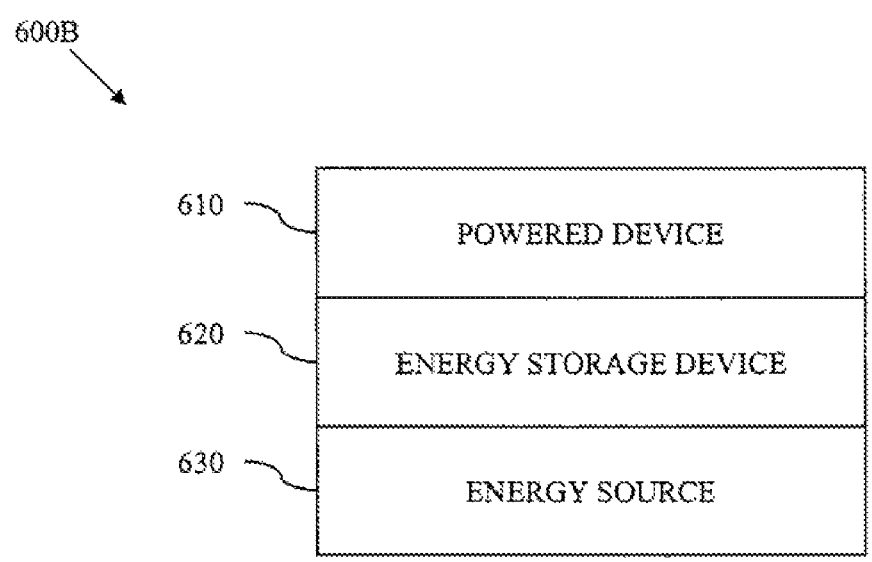
FIG. 6B is a schematic view of at least a portion of another embodiment of the apparatus shown in FIG. 6A.

Referring to FIG. 6B, illustrated is a schematic view of at least a portion of another embodiment of the apparatus 600A shown in FIG. 6A, herein designated by the reference numeral 600B. The apparatus 600B may be substantially similar to the apparatus 600A, except that the energy source 630 may be directly coupled to the energy storage device 620 in the apparatus 600B. For example, the energy source 630 may be coupled to the energy storage device 620 by one or more layers which may be substantially similar to the interface layer 230 and/or the adhesive layers 340 described above. Consequently, the energy source 630 may be adjacent to or otherwise centrally located with the energy storage device 620, whereas the energy source 630 may be located remote from the energy storage device 620 in the apparatus 600A shown in FIG. 6A.

Having described the construction techniques utilized to integrate a micro-sale, nano-scale, or other miniature Energy Storage Device (ESD) with a semiconductor package, the following paragraphs focus on potential applications or implementations for such an integrated device (e.g., in the marketplace). Because of the broad base of applications or implementations for integrated devices as described herein, the overall applicable, product-driven markets where such devices may be applicable could be, but are in no way construed or interpreted to be limited to, market segments typically described as "automotive," "military," "industrial," "telecommunications," "medical" and "consumer." For each of these market segments, the following paragraphs are included as discussion by way of product examples in each market segment, suggested product solutions which may utilize an integrated circuit and ESD, or integrated circuit-ESD-energy generator combination of constructed components which may possess functional, useful and/or beneficial operational advantages.

Applications of an integrated ESD device according to aspects of the present disclosure and applicable to the automotive market segment include security keys, locks and ignition systems, automobile-body-mounted crash sensors, tire air pressure sensors, or consumable product status sensors and indicators, among others. One example is a device employed with a typical automotive air intake line, where a low cost air-pressure sensor which measures air pressure can be utilized to indicate the volume of airflow into the carburetor. A contaminated or failing air filter may yield a measurable increase in air intake pressure from a known airflow operating condition, which may be empirically measured if a sensor is physically located on an air intake path or manifold just past the air filter element. In such an implementation, a single integrated package containing a MEMS type of pressure sensor, an ESD rechargeable battery, and a MEMS based kinetic power source, all collocated and encapsulated or otherwise integrally packaged into an automotive-ergonomic compatible package, may be placed on an air inlet hose or manifold located in a position following the air filter but in front of the carburetor (or other air inlet to the engine). An autonomous, self-powered pressure sensor of this type may give indication to the vehicle owner/operator of a filter-replacement requirement, such as via illumination of a light emitting diode (LED).

Military applications for an integrated ESD type of device according to aspects of the present disclosure include countermeasure devices such as infrared chafes, smart munitions on small caliber munitions rounds, anti-fuse based solid state detonators, or consumable chemical or biological agent detectors. For example, a contemporary military aircraft countermeasure to an adversarial firing of a heat-seeking or infrared-guided missile is the use of infrared (IR) generating chafes. The chafe is a small device typically containing a hydrocarbon-based fuel that, when ignited, burns hot enough to give off an emission of thermal infrared energy. This infrared energy signature is intended to be of sufficient luminescent quantity, and of sufficient time duration, to duplicate the energy signature of the aircraft jet engine. The diversionary and decoy properties of the deployed chafes cause the heat-seeking guidance system of the adversarial missile to become confused as to which glowing object is the targeted aircraft engine. As the aircraft maneuvers away from the deployed chafes, the infrared signature of the chafes becomes more predominate than the IR emission signature of the targeted jet engine, and the missile subsequently follows the new, brighter signature of the decoy chafes. This diversionary and decoy mechanism of substituting the infrared signature of chafes for the infrared signature of targeted jet engines is an effective countermeasure in a threatening and potentially lethal situation where both the aircraft and its pilot avoid the catastrophe of being destroyed by an adversary's guided missile.

The chafes are typically a fueled, pyrotechnic device. An ESD-based intelligent chafe, constructed according to aspects of the present disclosure, may be produced in virtually any favorable airborne geometry. As chafes typically have flat- and rounded-disk form factors, each chafe disk may be configured to contain an ESD type of device which allows for a delayed-fuse activation of a high-intensity, infrared light emitting source. According to aspects of the present disclosure, each chafe disk may contain one, two or more conductive elements that, when aligned into a launching cylinder, are utilized to electronically activate the infrared emitting source on the disk. When stacked in numbers and aligned in a firing cylinder, the chafes can be launched or propelled from the cylinder when activated. Potential benefits of utilizing this method of countermeasure include the geometric coverage area of the infrared signature left behind the targeted aircraft by the launched chafes, their programmable timing for activation delay from launch, their illumination duration, and their intensity of the infrared emission in each chafe.

Industrial applications of ESD based devices according to aspects of the present disclosure include a variety of autonomous transducers and sensors, as well as manufacturing tracking, shipping, and product authenticity implementations. For example, one implementation may entail products which are manufactured utilizing highly-automated assembly processes, such as those processes which are substantially automated from beginning to end, including where an assembly process progresses with the insertion of various subassemblies into a manufacturing process carrier or tray. For purposes of discussion, the carrier or tray will be referred to hereafter as a "handler."

Because of the fully- or substantially-automated nature of the manufacturing process, human intervention may be kept at a minimum. A variety of sensors located within the conveyor system or assembly station of an assembly process may be utilized as quality-feedback mechanisms, such as to ensure that each process step is concluded with the desired result. At each step of the assembly or other manufacturing process, the sensors may allow the product to be either accepted and forwarded to the next assembly stage, or to be rejected from the assembly process entirely.

The continued acceptance or rejection of an assembled product during a manufacturing process may be known as "yield." Yield is a percentage calculation indicative of a ratio measure of the amount of product (e.g., production units) that are accepted through each process stage divided by the total number of units that started through the process stage. For example, the desired outcome may be to keep the automated process within sufficient quality parameters that the yield metric remains as high as possible. Because the automated manufacturing process may remove as much human intervention as possible, the handler may be created such that it may contain an intelligent measurement and communications device whereby the assembly performance results of each stage of the manufacturing process can be acquired and stored.

An integrally-packaged ESD device according to aspects of the present disclosure and configured for this exemplary industrial implementation may be molded or mounted into the handler. The device may contain a single or series of integrated circuits comprising, for example, a micro- and/or nano-technology-based, articulated MEMS- or NEMS-based gyroscope to detect assembly orientation. The device may contain a multi-function microcontroller interface that is capable of analog sensing, such as may be configured to sense temperature. The microcontroller may additionally be configured to perform conversion of the analog sensing signal into digital data, and the microcontroller or other portion of the device may also include memory for the storage of the digital data.

For example, during the assembly process, the handler may hold the assembly for a spray deposition process in such a way that robotic orientation of the device must be measured within six degrees of freedom, for specific amounts of time, and at specific spray deposition temperatures. Following the spray deposition process, a high-temperature curing process may involve similar actuation of the handler in six degrees of freedom and with specific amounts of time at specific curing temperatures. Upon entry to this particular manufacturing stage, the integrated circuit of the integrated ESD device package according to aspects of the present disclosure may be activated through the use of a magnetic Hall Effect transistor, for example. Upon activation, the microcontroller may begin to sense signals from the MEMS gyroscope and/or the temperature sensor and, possibly with each measurement cycle, store the results of the measurement within a static random access memory of the microcontroller or other portion of the integrated ESD device.

With the microcontroller now active, the handler may proceeds through the spray deposition stage followed by the high-temperature curing stage. In each stage, data indicative of the condition of the handler orientation and temperature may be collected and/or stored in the integrated ESD device of the present disclosure. Upon completion of the high-temperature curing stage, the handler may be exposed to an RF field within sufficient proximity to allow for the initiation and transfer of data from the integrated ESD device of the handler to a process controller.

The process controller may read the digitally encoded data and, possibly through the use of the aforementioned Hall Effect switch, turn off or otherwise deactivate the integrated ESD device. With the data from the integrated ESD device contained in the handler, the process controller may examine the data contained in the process assembly handler and make a determination, possibly based on predetermined manufacturing process attributes, whether the assembly contained in the handler has successfully completed the manufacturing process stage. If the determination is positive, the handler and its associated assembly may be allowed to pass to the next assembly stage. If the determination is negative, the assembly may be rejected from the manufacturing process and discarded from the handler. Further, if the determination is negative, and once the assembly is removed from the handler, the handler may be allowed to return to the start and be reused for a new subassembly to pass through the same manufacturing stages.

Within the telecommunications market segment, applications or implementations for integrated ESD-device packages may exist in terrestrial, cellular, radio, copper-line-based, and/or high-speed optical networks or network components. For example, one such implementation may entail a single, highly-reliable, optical cross-connect switching apparatus. From a historical perspective, system components contained within an optical communications network typically employ conversion processes for translating between optical and electrical signals. Further, the efficiency of an optically-switched network device can be measured by the amount of time that is necessary to perform the conversion of optical signals of an inbound optical port to an inbound electrical data path, the switching of the inbound electrical data path to an outbound electrical data path, and the conversion of the outbound electrical data to an outbound optical port. In addition, this switching process must be highly reliable. Contemporary definitions of telecommunications reliability may include a standard of 99.9999% functional operation, among other examples. While many producers of optically-switched network equipment have developed products which meet the reliability standards as mentioned, switching performance may remain limited by the two-step electronic data path of optical signal conversion processes.

In considering the elimination of the electrical-optical conversion processes to optimize optical switching, an integrated ESD device package of the present disclosure, integrating an ESD and a micro- or nano-technology-based, cantilevered and articulated MEMS- or NEMS-actuated mirror device in a single package, may be utilized as a photonic switch to cross-connect inbound optical data to an outbound optical port while minimizing the attenuation loss of the interface between the photonic interconnect. Further, to sustain the high-reliability operating performance standard of 99.9999%, such an integrated ESD device package may be utilized to sustain the actuated mirror assembly's position of reflection between the inbound and outbound optical ports during periods of fluctuating electrical brown-out or loss of power. The integrated ESD device package may additionally or alternatively be configured to power one or more on-board optical amplifiers employed to minimize the photonic attenuation. As photonic switching elements are typically deployed in an N element by M element matrix format, the integrated ESD device package of the present disclosure may become more attractive for the incorporation of redundant energy in larger switching matrix sizes.

The medical market segment provides the opportunity for autonomously operating micro- and nano-technology derived MEMS- and NEMS-fabricated devices in applications of organ and muscle stimulators, bone and tissue growth stimulators, hormonal or enzyme level detectors, drug dispensers, neurological activity sensors, viral and bacteriological detectors, and automatic genetic or chemical assays, among others. One product example utilizing aspects of the present disclosure may be achieved for a disposable temperature thermometer. Utilizing an integrated ESD-device package of the present disclosure, integrating a temperature sensor located on a surface of the ESD frame with and a microcontroller and low-cost, flexible, organic display system located on an opposite surface of the ESD frame, a highly-accurate digital thermometer may be enclosed in low-cost, ABS-type injection molded or polyester film formed plastic which can be attached to a patient's skin.

Any number of possible activation methods may be employed to begin the measurement operation, including mechanical, resistance, capacitive, piezoelectric, and/or pressure switching, or a combination thereof. Upon activation, the microcontroller may begin the measurement of the temperature induced by an integrated or external thermal sensor and subsequently display the results in any of a variety of formats based on the design of the display mechanism. The display mechanism may include a series of individually colored organic light emitting diodes (LEDs) and/or other LEDs, a plasticized, color, thin-film display for a bar type display, or a thin-film transistor digital display of colored numerals which display legible digits, among other display types. Once the measurement cycle is completed, the thermometer can be removed from the patient's skin and possibly discarded.

Applications or implementations for integrated ESD-device packaging aspects of the present disclosure regarding products for consumer markets include sporting goods, gaming or casino tokens, jewelry, educational assistance and personal productivity tools. One exemplary implementation is a "mood" ring. While a mood ring cannot reflect an individual's mood with any real scientific accuracy, it can indicate an individual's involuntary physical reaction to an emotional state. The stone in a mood ring is typically a clear glass stone sitting on top of a thin sheet of liquid crystals. Contemporary nano-technology and/or organically-derived liquid crystal molecules can be very sensitive, changing orientation position or twist according to changes in temperature. This change in molecular structure affects the wavelengths of light that are absorbed or reflected by the liquid crystals, resulting in an apparent change in the color of the stone. The typical colors of the mood ring vary, by coolest to warmest temperature, from dark blue, blue, blue-green, green, amber, grey, and black, for example.

Relative to aspects of the integrated EDS-device packaging described herein, a mood ring can be configured such that one surface of the ESD frame contains a kinetic energy harvester that is utilized to convert motion of hand or finger movements into electric energy. An opposing surface of the ESD frame may contain one or more low-power or other LEDs for illumination with a laminated, liquid crystal display that is color-sensitive to heat and/or electrical stimulus. The ESD package may be positioned inside the body of the ring band, and a transparent, artificial gem store may be placed on the top of the ring band opening. As the ring conducts heat and transforms motion of the wearer to electricity, the liquid crystal display may change colors depending on the finger temperature and electrical energy received from the kinetic energy harvester contained in the ESD-device package positioned beneath the transparent stone.

For example, the color green, which signifies "average" on a mood ring color-scale, may be calibrated to the average person's normal finger surface temperature, such as about 82° F. (28° C.). By amplifying the increased or decreased thermal effects and/or by utilizing the transformed kinetic energy stored as electricity in the ESD, the illuminated liquid crystals may become visibly more distinguishable as the thermal effect changes their color.

Other implementations or applications within the scope of the present disclosure, whether within the above-described market segments or otherwise, may utilize an integrated battery-device package that may not be substantially planar, as in the examples depicted in the Figures discussed above. In contrast, the integrated package may be substantially spherical or otherwise non-planar. One such example includes an ESD having at least one substantially spherical surface mated with a substantially spherical semiconductor device, such as those developed by Ball Semiconductor, Incorporated. Spherical geometry of the ESD and device integrated therewith may allow one or more circuits to be located on a spherical semiconductor or other integrated circuit device substrate and be routed or wound around an appropriate portion of the spherical or otherwise non-planar surface, such as may be utilized to create a property of inductance. The added semiconducting material feature dimension of height may allow greater inductance values compared to those achievable on substantially planar chip surfaces. Additionally, such windings can be utilized as an antenna, such as to provide or support wireless communication between sensors implanted in the body and external, peripheral devices, for example. Such configurations may provide sensors with true, three-dimensional data acquisition capabilities. Moreover, sensors placed on the spherical surface may be configured to perform multidirectional sensing, and may be capable of generating data that is more comprehensive than conventional sensors.

Additionally, embodiments in which the integrated ESD-device package is configured to be implanted into a living human or other animal may eliminate the wires, cables, and tubes that conventionally encumber a patient. For example, the integrated ESD-device package may be configured as a self-powered sensor that, for example, may be swallowed by a patient to monitor vital signs internally, possibly with three-dimensional sensing capability. Such implementations of the integrated ESD-device package aspects of the present disclosure may also be utilized, for example, in operating rooms to track surgical instruments and sponges embedded with or coupled to embodiments of the integrated ESD-device package, or as embedded in surgical instruments to provide limited or single-use corrective processes which may aid in the correction of a patient's medical or surgical condition.

For example, when a patient is subjected to major surgery, surgeons or other medical professionals are required to conduct a "sponge count" before opening and before closing the patient, thereby ensuring that none of the surgical sponges or other surgical equipment is inadvertently left inside the patient. The count is typically performed by hand and, in the case of a miscount, x-rays are required to locate the missing sponge or other surgical implement. In contrast, an electronically-tagged instrument incorporating an integrated ESD-device package according to aspects of the present disclosure may be located with more simpler, potentially hand-held scanners, including those operable via radio-frequency or other wireless protocols that pose significantly reduced health-risks to the patient and surgical team compared to the use of x-ray apparatus.

Another example is a limited use, potentially specialized, spherical scalpel which may be configured in conjunction with an integrally packaged or otherwise associated ESD. Such a scalpel may be utilized to cauterize arteries and aid in the elimination of bleeding, among other potential uses and benefits. Additional implementations utilizing the spherical configuration described above include sensor-tipped catheters or guide wires, wireless electrodes, implantable neurostimulation devices, and a proprietary chromatography technique. Applications for micro- and nano-technology derived and/or other MEMS- and NEMS-based sensing elements may also include implant markers, sensor-tipped catheters, and swallowable vital sign sensors.

In addition to reexamining the optimal shape of sensing devices, dramatic reduction in sensor size is making new applications possible. Integrated Sensing Systems, Inc. (Ann Arbor, Mich.) is developing a pressure sensor that is only 0.25 mm wide, which is small enough to fit inside the eye of a needle, as well as inside most catheters. A single sensor may be used to measure the internal pressure of organs or wounds. With a pair of the devices, a pressure drop across an arterial obstruction may also be measured. A sensor array may also be utilized to characterize flow across long arterial or intestinal sections. The micro-scale sensor may provide a pressure range between about 0 and about 1200 torr, with a resolution of less than about 0.3 torr.

Figure 7:
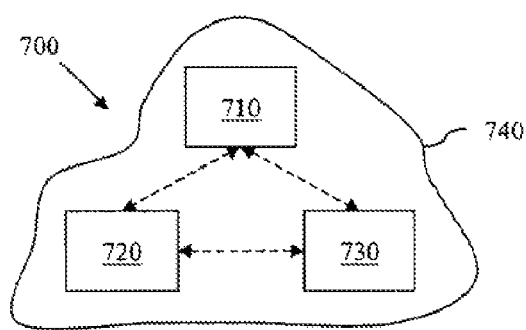
FIG. 7 is a schematic view of at least a portion of an embodiment of apparatus according to aspects of the present disclosure.

Referring to FIG. 7, illustrated is a block diagram of at least a portion of an embodiment of apparatus 700 according to aspects of the present disclosure. The apparatus 700 may be a wireless device configured to be permanently or temporarily implanted or attached to a living human, bovine, equine, caprine, porcine, ovine, canine, feline, avian, or other animal. The apparatus 700 may also be a wireless device configured to be permanently or temporarily implanted or attached to an animal carcass, such as in a meat-processing facility.

The apparatus 700 may be configured as a wireless tracking device, such as to track the movement of a living animal, including in real-time. The apparatus 700 may also or alternatively be configured as a wireless device for sensing a characteristic of the animal or environment in which the apparatus 700 is deployed. The apparatus 700 may also be configured to transmit information pertaining to the sensed characteristic, or to transmit information pertaining to the characteristic as sensed by another device or apparatus in communication with the apparatus 700.

For example, the apparatus 700 may be configured to be utilized as a device for transmitting heart waveform signals as part of an electrocardiogram test procedure (ECG), or as a sensor on an aircraft wing which wirelessly communicates with a peripheral base unit. However, the myriad implementations, applications and configurations of the apparatus 700 within the scope of the present disclosure are not limited to these exemplary embodiments or functions.

The apparatus 700 includes one or more antenna 710, an integrated circuit (IC) chip or device 720, and an energy supply or energy source 730. The antenna 710, IC chip 720 and energy supply 730 are enclosed within a packaging material 740. Each of the antenna 710, IC chip 720 and energy supply 730 are electrically coupled to at least one of the other components, as indicated by the dashed arrows in FIG. 7, although one or more of the components may not be coupled to each of the other components, contrary to the example shown in FIG. 7. Such electrical coupling may be via one or more traces, wire bonds, contacting contact pads, electrically conductive adhesive, solder, stud bumps, and/or other means.

The energy supply 730 may be collocated with the IC chip 720 within the packaging material. For example, the energy supply 730 and the IC chip 720 may be arranged substantially side-by-side, such as the energy device 130 and each of the devices 570, 580 shown in FIG. 5H. A surface of the energy supply 730 may be in substantial contact with a surface of the IC chip 720, whether directly or via a thin layer employed, for example, to improve adhesion and/or electrical characteristics of the two components relative to each other. However, the collocation of the two components does not necessarily require or imply that the footprints of the components are either substantially similar or aligned (e.g., rotation or "clocking" relative to each other). In addition, the antenna 710 may be similarly collocated with one or both of the energy supply 730 and the IC chip 720.

The IC chip 720 and the energy supply 730, and possibly the antenna 710, are collectively formed, fabricated, assembled, bound, co-joined, and/or otherwise oriented in such collocated arrangement prior to being encapsulated within the packaging material 740. In contrast, conventional packaging processing can entail an initial packaging process to encapsulate the IC chip 720, such as after bonding the IC chip 720 to a lead frame, and an additional packaging process to encapsulate the packaged IC chip 720 with an energy supply 730. This conventional packaging method can be disadvantageous, such as where the additional packaging process excessively adds bulk or height to the finished product, or where the additional packaging process presents an environmental risk to the previously packaged IC chip 720 (such as to exposure to high temperature, stress build-up, additional handling, and/or other factors).

The antenna 710 is configured as a means for transmission and/or receipt of wireless signals across the boundary between the outer surface of the packaging material 740 and the surrounding environment. For example, the antenna 710 may comprise a member having a rod-shaped, ring-shaped, helical and/or other geometry, and may comprise aluminum, copper, gold and/or other electrically conductive materials. The antenna 710 may transmit and/or receive signals wirelessly between sensors and/or actuators located within and/or externally to the device 700 and external peripherals. Such wireless communication may be via IEEE 802.15.1 (also known as Bluetooth), ultra-wide-band (UWB), IEEE 802.16 (also known as WiMAX), IEEE 802.11b (also known as WiFi), IEEE 802.11a, IEEE 802.11g, and/or other wireless communication protocols.

The antenna 710, or an array thereof, may be physically secured within the apparatus 700, such as to the integrated circuit 720 and/or the energy source 730, whether directly or indirectly, by adhesive, bonding, brazing, clamps and/or other mechanical fasteners, and/or by other means. For example, the antenna 710 may be attached to the IC chip 720 by micro- or nano-technology-based deposition or polysilicon etch processing. The length, overall dimensions, or other dimensions of the antenna 710, each antenna 710 where multiple are employed, or an array of antenna 710 where employed, may range between about 1 mm and about 3 mm, although other dimensions are also within the scope of the present disclosure.

The antenna 710 may include, or be considered to include, some degree of circuitry, such as to allow the wireless transmission or receipt of signals, and may include some aspects of wired and/or wireless networking. The signals transmitted via the antenna 710 may include data related to, for example, one or more characteristics of the environment in which the apparatus 700 is employed, such as may be sensed by a portion of the IC chip 720. The signals transmitted via the antenna 710 may include data related to, for example, a status of the IC chip 720, energy supply 730, and/or other portion of the apparatus 700.

The IC chip 720 may comprise a plurality of active and/or passive silicon- and/or other semiconductor-based devices, such as the devices 222 described above with respect to FIG. 3. The IC chip 720 may be substantially similar to the device 220 shown in FIG. 4C, the devices 570/580 shown in FIG. 5F, and/or the device 555 shown in FIG. 5H. The IC chip 720 and may include circuitry configured to manipulate signals received from a sensor component and/or to be sent to an actuator component, whether such sensor and actuator components are located within the IC chip 720, otherwise within the apparatus 700, or external to the apparatus 700. The integrated circuit 720 may also include circuitry configured to prepare a signal and oscillatory mechanism utilized to, for example, transmit and/or receive signals via the antenna 710, such as via one or more of the wireless protocols described above. The integrated circuit 720 may also be secured to the antenna 710, the energy storage device 730, or both, such as via adhesive, bonding, brazing, clamps and/or other mechanical fasteners, and/or by other means.

The energy supply 730 may be or include a nuclear battery, a MEMS- or NEMS-based thin-film fuel cell, a single or plural configuration of photovoltaic cells, Ferro-electric or RF energy collectors which may be similar to RFID Tag and Electronic Product Code (EPC) implementations, acoustic or mechanical vibration piezoelectric energy harvesters, and/or others, including those described above with respect to the energy device 630 shown in FIGS. 6A and 6B. The energy supply 730 may substantially include an energy storage device as described herein, or may additionally include an energy harvesting and/or generation device. Moreover, as with the energy cell described above with respect to FIGS. 1A-1C. The energy supply 730 may be directly or indirectly coupled to the IC chip 720 and/or the antenna 710.

As mentioned above, the antenna 710 (or array thereof), the IC chip 720 and the energy supply 730 may be substantially or entirely encapsulated or otherwise enclosed within the packaging material 740. The packaging material 740 may include a ceramic, plastic, metallic or otherwise protective and at least partially enclosing substance, such as may be intended to yield its internal components as a single, integrated package. For example, the packaging material 740 may have a composition that is substantially similar to that described above with reference to the apparatus 300 shown in FIG. 4C.

The packaging material 740 may be substantially or essentially sealed, or may substantially or essentially seal the collocated and other components of the apparatus 700, such as to prevent access by an end-user to the sealed components of the apparatus 700. The packaging material 740 may also be configured or selected to have a predetermined or otherwise appropriate environmental permeability, such as to effectively allow the collocated energy supply 730, IC chip 720 and/or antenna 710 to perform the desired sensory, computational, and/or communications functions. For example, the packaging material 740 may form a protective enclosure having an internal cavity which may substantially conform to an outer profile of the collocated antenna 710, energy supply 730 and IC chip 720, collectively, and may have environmentally permeable transmission properties selected or configured to permit the ingress and/or egress of electromotive and/or other environmental material characteristic properties.

Figure 8A:
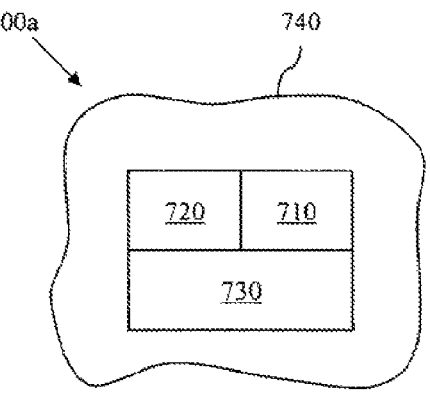
FIG. 8A is a schematic view of another embodiment of the apparatus shown in FIG. 7.

Referring to FIG. 8A, illustrated is a block diagram of at least a portion of an embodiment of the apparatus 700 shown in FIG. 7, herein designated by the reference numeral 800a. The apparatus 800a is substantially similar to the apparatus 700 shown in FIG. 7 except as described below. The antenna 710, the IC chip 720 and the energy supply 730 of the apparatus 700 are electrically coupled, but may not be physically coupled, despite being collocated. In contrast, the antenna 710, the IC chip 720 and the energy supply 730 of the apparatus 800a are not only electrically coupled, but are also physically coupled in direct contact. However, the direct physical contact may be via an interposing material configured, for example, to enhance adhesion, electrical conductivity and/or electrical isolation. Moreover, the electrical coupling between the antenna 710, the IC chip 720 and the energy supply 730 of the apparatus 800 may be via the direct physical coupling described above.

Figure 8B:
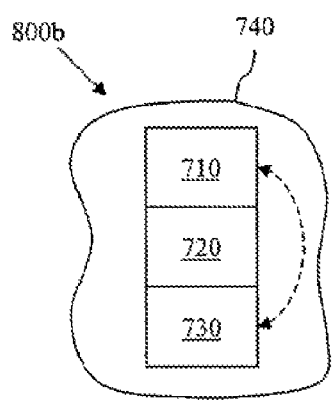
FIG. 8B is a schematic view of another embodiment of the apparatus shown in FIG. 7.

Referring to FIG. 8B, illustrated is a block diagram of at least a portion of an embodiment of the apparatus 800a shown in FIG. 8A, herein designated by the reference numeral 800b. The apparatus 800b is substantially similar to the apparatus 800a except as described below. The antenna 710 and the IC chip 720 of the apparatus 800a are each electrically coupled and physically coupled to the energy supply 730 by direct physical contact. However, the antenna 710 of the apparatus 800b is not physically coupled to the energy supply 730 by direct physical contact. In contrast, the antenna 710 of the apparatus 800b is physically coupled to the IC chip 720 by direct physical contact, as "coupling by direct physical contact" is described above (a convention followed in the description below), and is electrically coupled to the energy supply 730 indirectly via the IC chip 720 and, possibly, one or more wire bonds, traces, and/or other conductive members. Nonetheless, the antenna 710, the IC chip 720 and the energy supply 730 are each electrically coupled to the other two components, whether directly or indirectly, such as the electrical coupling of the antenna 710 and the energy supply 730 indicated in FIG. 8B by the dashed arrows.

In an implementation similar to the apparatus 800b, the energy supply 730 may interpose and be physically and electrically coupled to the IC chip 720 and the antenna 710 by direct physical contact, in contrast to the IC chip 720 interposing and being physically and electrically coupled to the energy supply 730 and the antenna 710 by direct physical contact as shown in FIG. 8B.

Figure 8C:
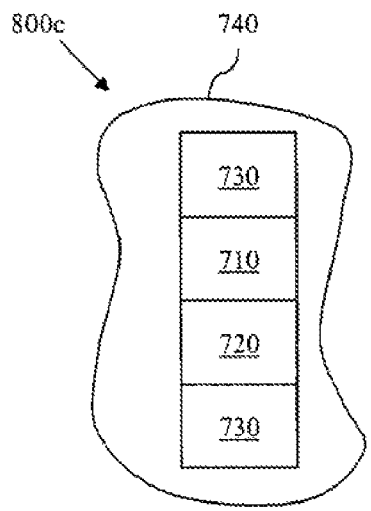
FIG. 8C is a schematic view of another embodiment of the apparatus shown in FIG. 7.

Referring to FIG. 8C, illustrated is a block diagram of at least a portion of an embodiment of the apparatus 800a shown in FIG. 8A, herein designated by the reference numeral 800c. The apparatus 800c is substantially similar to the apparatus 800a except as described below. That is, the antenna 710 is directly coupled by physical contact to the IC chip 720, but the antenna 710 and the IC chip 720 are each individually coupled directly to a separate energy supply 730 by direct physical contact. In a similar implementation, the separate energy supplies 730 are actually different portions of the same energy supply, such that the antenna 710 and the IC chip 720 are each directly coupled by physical contact to a corresponding portion of the energy supply 730.

Figure 8D:
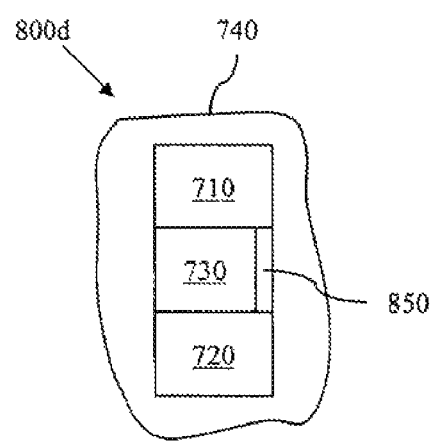
FIG. 8D is a schematic view of another embodiment of the apparatus shown in FIG. 7.

Referring to FIG. 8D, illustrated is a block diagram of at least a portion of an embodiment of the apparatus 800b shown in FIG. 8B, herein designated by the reference numeral 800d. The apparatus 800d is substantially similar to the apparatus 800b, except as provided below. That is, in the apparatus 800d, the energy supply 830 physically interposes and directly contacts the IC chip 720 and the antenna 710, in contrast to the IC chip 720 interposing and directly contacting the antenna 710 and the energy supply 730, as in the apparatus 800b. The antenna 710 and the IC chip 720 of the apparatus 800d are each independently coupled directly to opposing sides of the energy supply 730 by direct physical contact, but are not coupled together by direct physical contact. However, the apparatus 800d includes an electrical conduit 850, such as an electrically conductive metallic substance, spanning between the antenna 710 and the IC chip 720 to provide electrical connection. All four components (710, 720, 730 and 850) are substantially or essential encapsulated or otherwise enclosed within the packaging material 740.

Figure 8E:
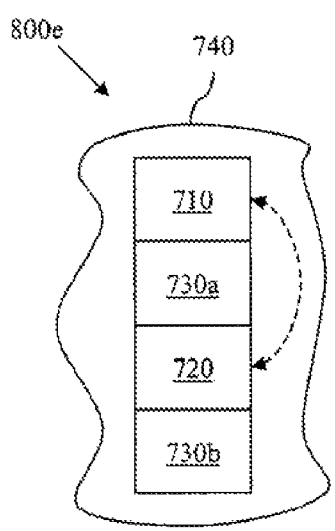
FIG. 8E is a schematic view of another embodiment of the apparatus shown in FIG. 7.

Referring to FIG. 8E, illustrated is a block diagram of at least a portion of an embodiment of the apparatus 800c shown in FIG. 8C, herein designated by the reference numeral 800e. The apparatus 800e is substantially similar to the apparatus 800c except as described below. For example, in the apparatus 800e, the energy storage device 730 includes of two components 730a and 730b, the antenna 710 is directly coupled to the first component 730a by direct physical contact, and the IC chip 720 is directly coupled to both components 730a and 730b. Operational energy required by the antenna 710 may be provided by the energy supply component 730a, whereas operational energy required by the IC chip 720 may be provided by either or both of the energy supply components 730a and 730b, whether continuously or in tandem. For example, the energy usage requirements of the IC chip 720 may be substantially greater (in magnitude and/or duration) relative to the energy usage requirements of the antenna 710. Alternatively, if the antenna 710 has higher energy usage requirements than the IC chip 720, the position of these two components within the configuration of the apparatus 800e may be switched. However, in either case, the antenna 710 may be electrically coupled to the IC chip 820 indirectly by one or more conductive members, as indicated by the dashed arrow in FIG. 8E. Additionally, the separate energy supply components 730a and 730b shown in FIG. 8E may actually be different portions of a single energy supply, such as may be segmented, sectored, dedicated or otherwise correspond to the different components 710, 720 of the apparatus 800e.

Figure 9A:
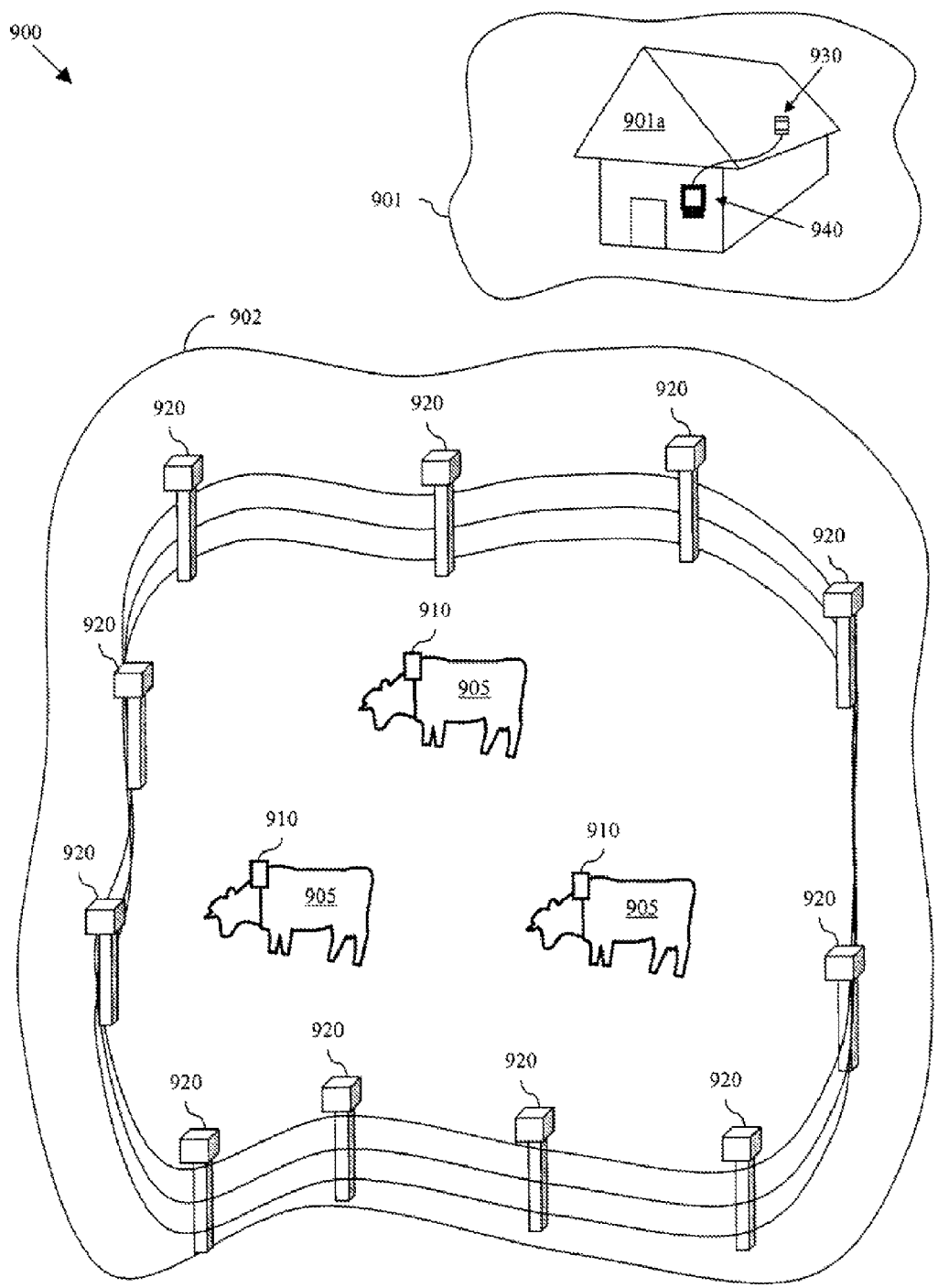
FIG. 9A is a schematic view of a system and apparatus according to aspects of the present disclosure.

Referring to FIG. 9A, illustrated is a schematic view of at least a portion of an embodiment of a system 900 according to aspects of the present disclosure. The system 900 is one environment in which the apparatus 700, 800a, 800b, 800c, 800d, and/or 800e described above, among others described herein or otherwise within the scope of the present disclosure, may be implemented. For example, the system 900 includes wireless devices 910 configured to transmit the location of animals 905 and/or other information to one or more of a string of positionally-fixed "fence-post" devices 920, which may in turn communicate the same and/or additional information to a peripheral base station 930, wherein each of the wireless devices 910 may be substantially similar to one or more of the apparatus 700, 800a, 800b, 800c, 800d, and/or 800e described above, among others described herein or otherwise within the scope of the present disclosure.

Figure 9B:
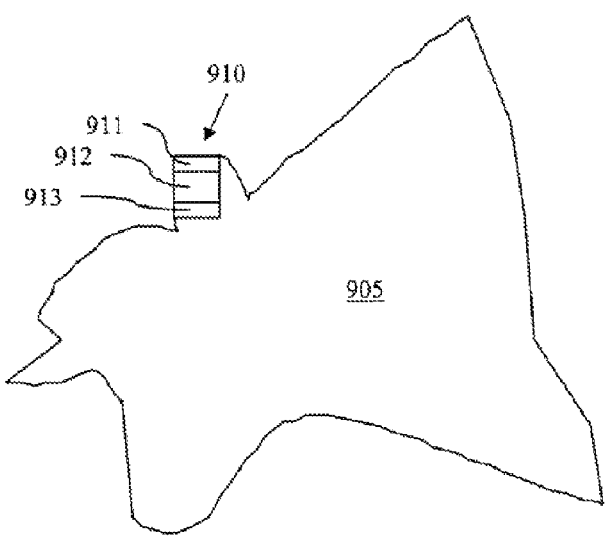
FIG. 9B is a schematic view an embodiment of apparatus shown in FIG. 9A.

Referring to FIG. 9B, illustrated is a schematic view of at least a portion of an embodiment of the wireless device 910 shown in FIG. 9A. The wireless device 910 may be attached, clipped, pinned or otherwise secured to the ear 905a or another part of the animal 905 in such a way that transmission of information pertaining to the location of the animal 905 (and the wireless device 910) to another entity is substantially indicative of such location. The scale of the wireless device 910 is such that it would not cause significant discomfort or harm to the animal 905.

The wireless device 910 may include an energy supply 912 coupled directly (by physical contact) or indirectly between an antenna 911 and an IC chip 913 configured to perform or otherwise support the wireless communication with the peripheral units 920 and/or 930 shown in FIG. 9A. The antenna 911, energy supply 912, and IC chip 913 may be substantially similar to corresponding components described above with reference to FIGS. 7 and 8A-8E, among others.

Figure 9C:
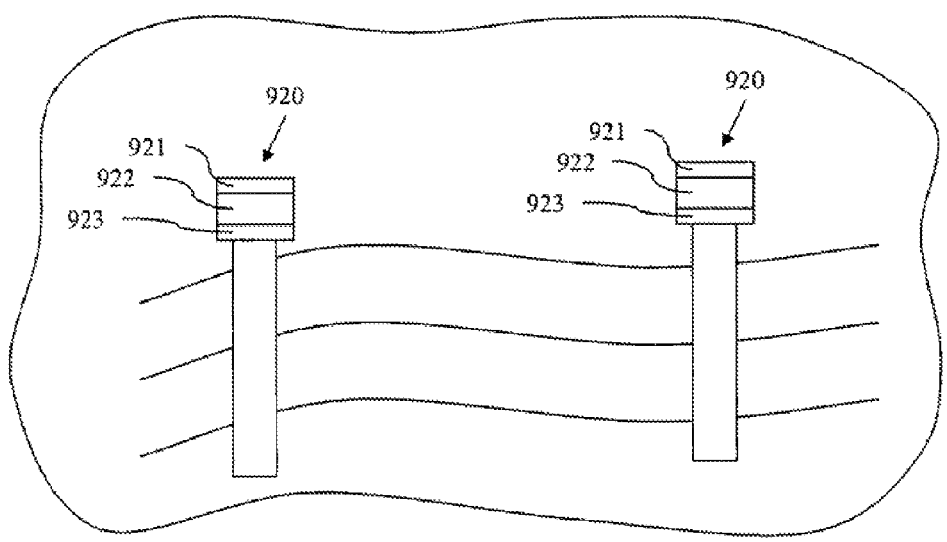
FIG. 9C is a schematic view an embodiment of apparatus shown in FIG. 9A.

Referring to FIG. 9C, illustrated is a schematic view of at least a portion of an embodiment of the peripheral unit 920 shown in FIG. 9A. The "fence-post" device 920 may be attached or otherwise bonded to a fence post 922 or other stationary object between which positional comparisons for the determination of proximity can be made with the wireless device 910. The device 920 may also be configured for wireless and/or wired communications with the peripheral base unit 930 shown in FIG. 9A.

The peripheral intermediary unit or fence-post device 920 may include an energy supply 922 coupled directly (by physical contact) or indirectly between an antenna 921 and an IC chip 923 configured to perform or otherwise support the wireless communication with the wireless devices 910, other peripheral intermediary units 920, and/or the peripheral base unit 930 shown in FIG. 9A. The antenna 921, energy supply 922, and IC chip 923 may be substantially similar to corresponding components described above with reference to FIGS. 7 and 8A-8E, among others.

Figure 9D:
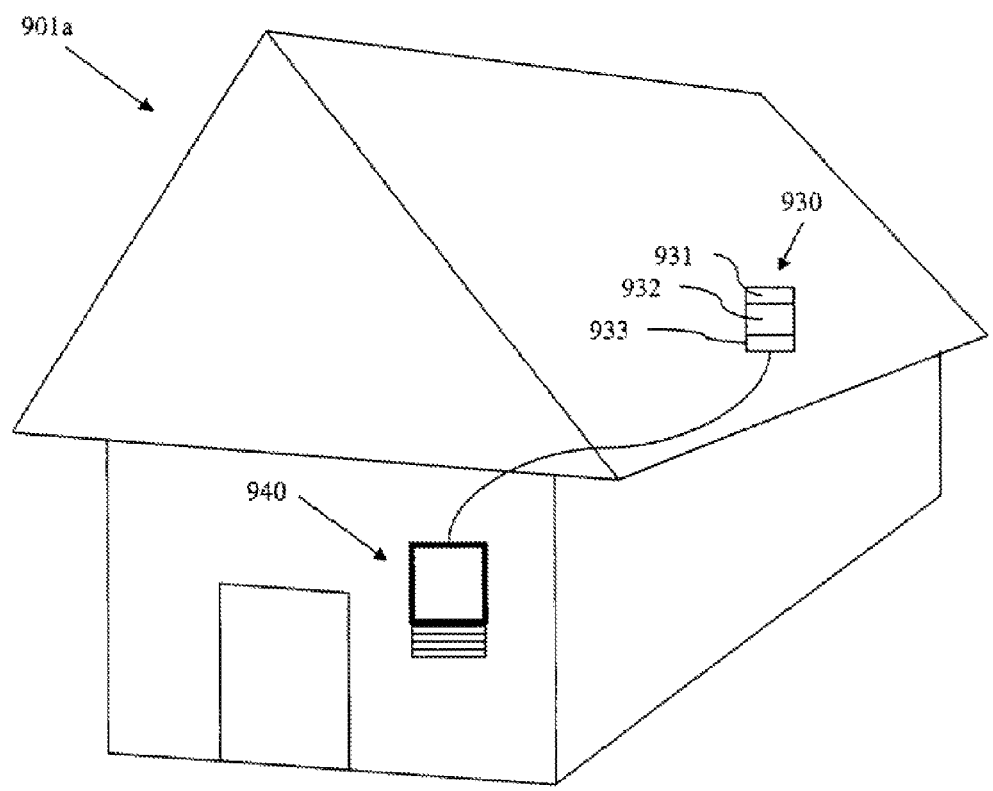
FIG. 9D is a schematic view an embodiment of apparatus shown in FIG. 9A.

Referring to FIG. 9D, illustrated is a schematic view of at least a portion of an embodiment of the peripheral base unit 930 shown in FIG. 9A. The peripheral base unit 930 may be attached or otherwise bonded to a house 901 *a*, such as to its rooftop. The peripheral base unit 930 is configured to send and receive transmissions with the fence-post devices 920 and/or the wireless devices 910.

The peripheral base unit 930 may include an energy supply 932 coupled directly (by physical contact) or indirectly between an antenna 931 and an IC chip 933 configured to perform or otherwise support the wireless communication with the wireless devices 910 and/or the peripheral intermediary units 920 shown in FIG. 9A, and/or an additional peripheral base unit 930. The antenna 931, energy supply 932, and IC chip 933 may be substantially similar to corresponding components described above with reference to FIGS. 7 and 8A-8E, among others.

Figure 9E:
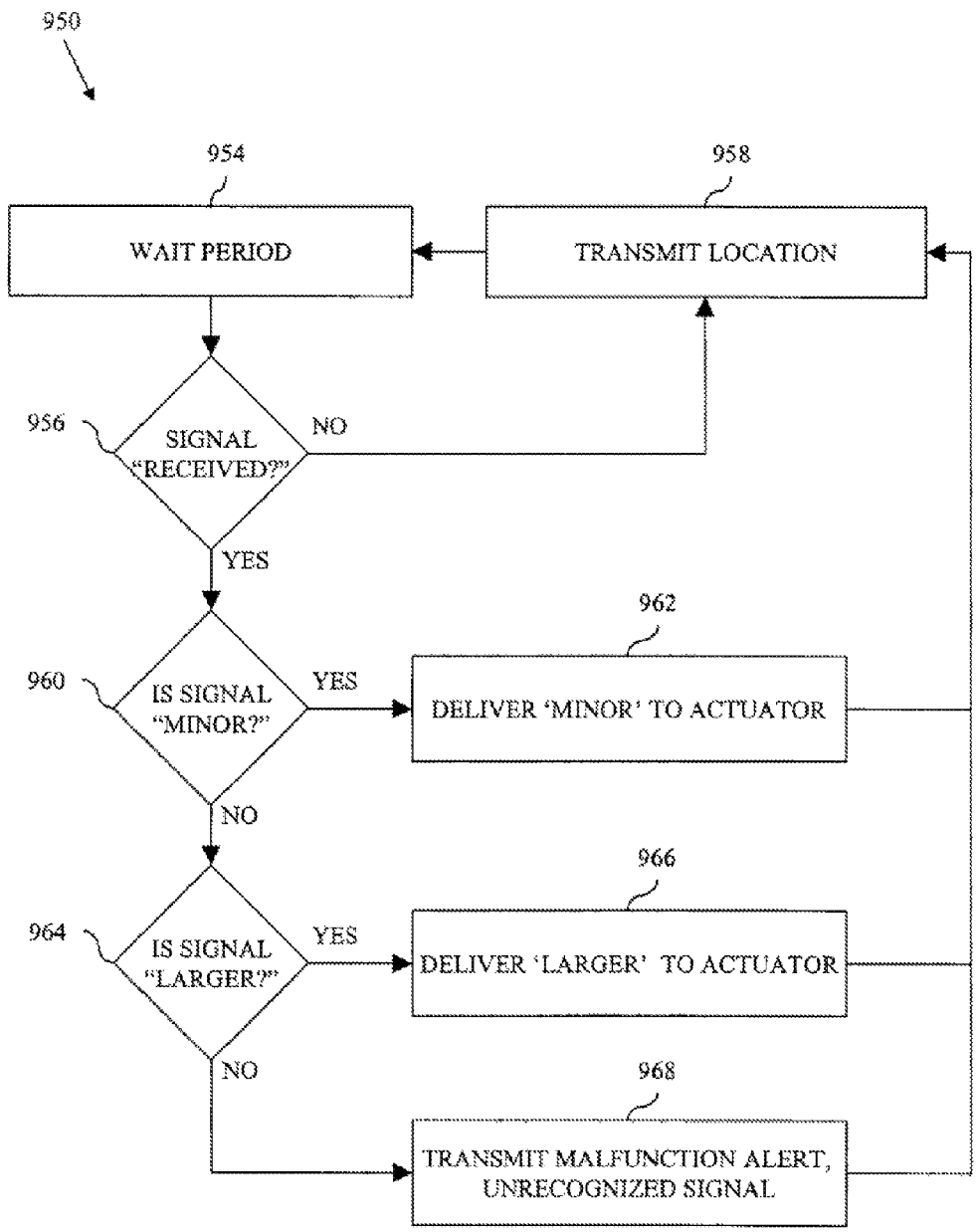
FIG. 9E is a flow-chart diagram of at least a portion of an embodiment of logic structure according to aspects of the present disclosure.

Referring to FIG. 9E, illustrated is a flow-chart diagram of at least a portion of an embodiment of the logic structure 950 of the IC chip 913 within the wireless device 910 shown in FIGS. 9A and 9B. The structure 950 includes a predetermined time interval 954, which may be about 5 seconds in duration, upon the expiration of which the wireless device 910 may be configured to determine whether it has received a signal from one of the stationary fence-post devices 920 shown in FIGS. 9A and 9C. If it has not, as determined by decisional step 956, then the wireless device 910 may transmit its location in a step 958 and subsequently return to the waiting interval 954.

If, however, the wireless device 910 has received a signal from a fence-post device 920, then the wireless device 910 examines the received signal to determine whether the received signal is a "minor," "larger," or unrecognized signal. If the received signal is a minor signal, as determined by a decisional step 960, then the wireless device 910 delivers a "minor" signal to an actuator of the wireless device 910 in a step 962, and steps 958 and 954 may then be subsequently performed. A "minor" signal may indicate that the animal 905 (and, hence, the wireless device 910) has moved to a location near or at a boundary of a predetermined area (e.g., a boundary of a grazing area). The "minor" signal may cause an actuator included in the wireless device 910 to emit an acoustic, electrical, vibration, aromatic or other signal which is reacted to by the animal 905, whether unconsciously, subconsciously or consciously by moving away from the boundary. The actuator may be integral to the IC chip 913 and, hence, integrally packaged with the energy supply 912, while in other embodiments at least a portion of the actuator may be separate from, distinct from, or otherwise external to the packaging material that substantially encloses the IC chip 913, energy supply 912, and antenna 911.

If the received signal is a "larger" signal, as determined by a decisional step 964, then the wireless device 910 delivers a "larger" signal to the actuator of the wireless device 910 in a step 966, and steps 958 and 954 may then be subsequently performed. A "larger" signal may indicate that the animal 905 (and, hence, the wireless device 910) has moved to or past the predetermined area boundary. The "larger" signal may cause the actuator included in the wireless device 910 to emit a more significant acoustic, electrical, vibration, aromatic or other signal, which may be more immediately reacted to by the animal 905 relative to the reaction to the "minor" signal, whether such reaction is unconscious, subconscious or conscious. Consequently, the animal 905 may be encouraged to more quickly move away from the boundary.

If the received signal is neither a "minor" signal nor a "larger" signal, as determined by decisional steps 956 and 964, collectively, then the wireless device 910 may be configured to transmit a malfunction alert to one or more of the fence-post devices 920 and/or the peripheral base unit 930 in a step 968. Steps 958 and 954 may then be repeated.

Figure 9F:
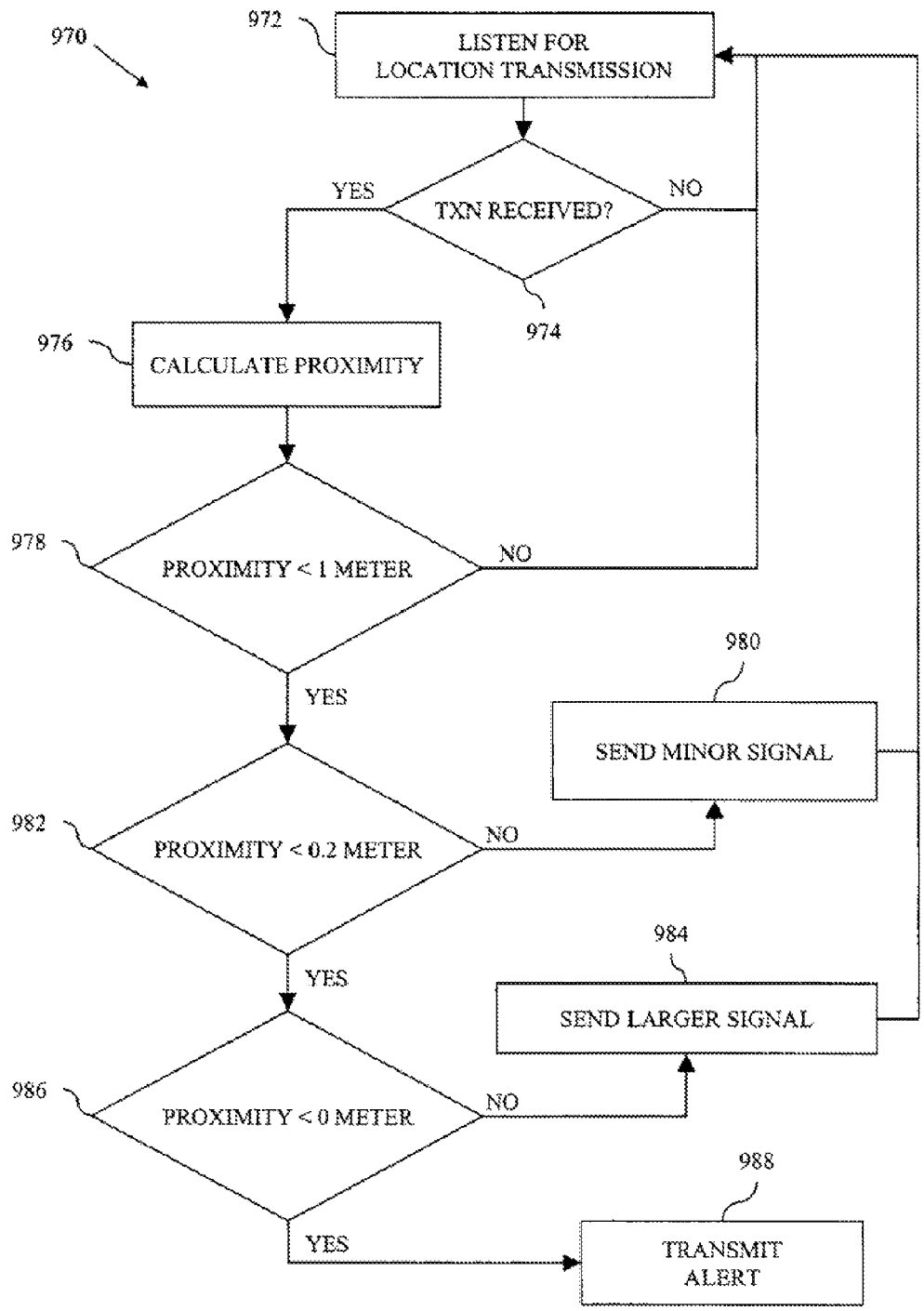
FIG. 9F is a flow-chart diagram of at least a portion of an embodiment of logic structure according to aspects of the present disclosure.

Referring to FIG. 9F, illustrated is a flow-chart diagram of at least a portion of an embodiment of logic structure 970 for the IC chip 923 within the stationary fence-post device 920 shown in FIGS. 9A and 9C. A default state 972 may be configured to find a wireless device 910 by listening for location transmissions from the wireless device 910. If no transmissions are received, as determined by a decisional step 974, the default state 972 may be resumed. However, once one of the wireless devices 910 comes into range of the fence-post device 920, as determined by decisional step 974, the proximity of the two devices may be calculated by a step 976 such that at least one of various actions may be performed based on the proximity.

For example, if the proximity is less than about one meter (or other arbitrarily determined distance), as determined by a decisional step 978, then a "minor" signal will be transmitted to the wireless device 910 in a subsequent step 980. If the proximity is less than about 0.2 meters (or other arbitrarily determined distance, less than the distance examined by decisional step 978), as determined by a decisional step 982, then a "larger" signal may be transmitted to the wireless device 910 in a subsequent step 984. If the proximity is determined to be less than 0 meters by a decisional step 986 and/or the decisional steps 978 and 982, collectively, such as if the animal 905 has strayed beyond the fence-line defined by the proximity calculated in step 976, then a priority escape alert message may be generated by one or more of the fence post devices 920 in a subsequent step 988, which may include successively transmitting the alert by the remaining fence post devices 920 back to the base station 930. The priority escape message may, in turn, be interpreted by the base station 930 and be displayed on a base station console 940 in communication with the base station 930, indicating to the operator that human intervention is required to herd the animal 905 back within the intended boundary.

Figure 9G:
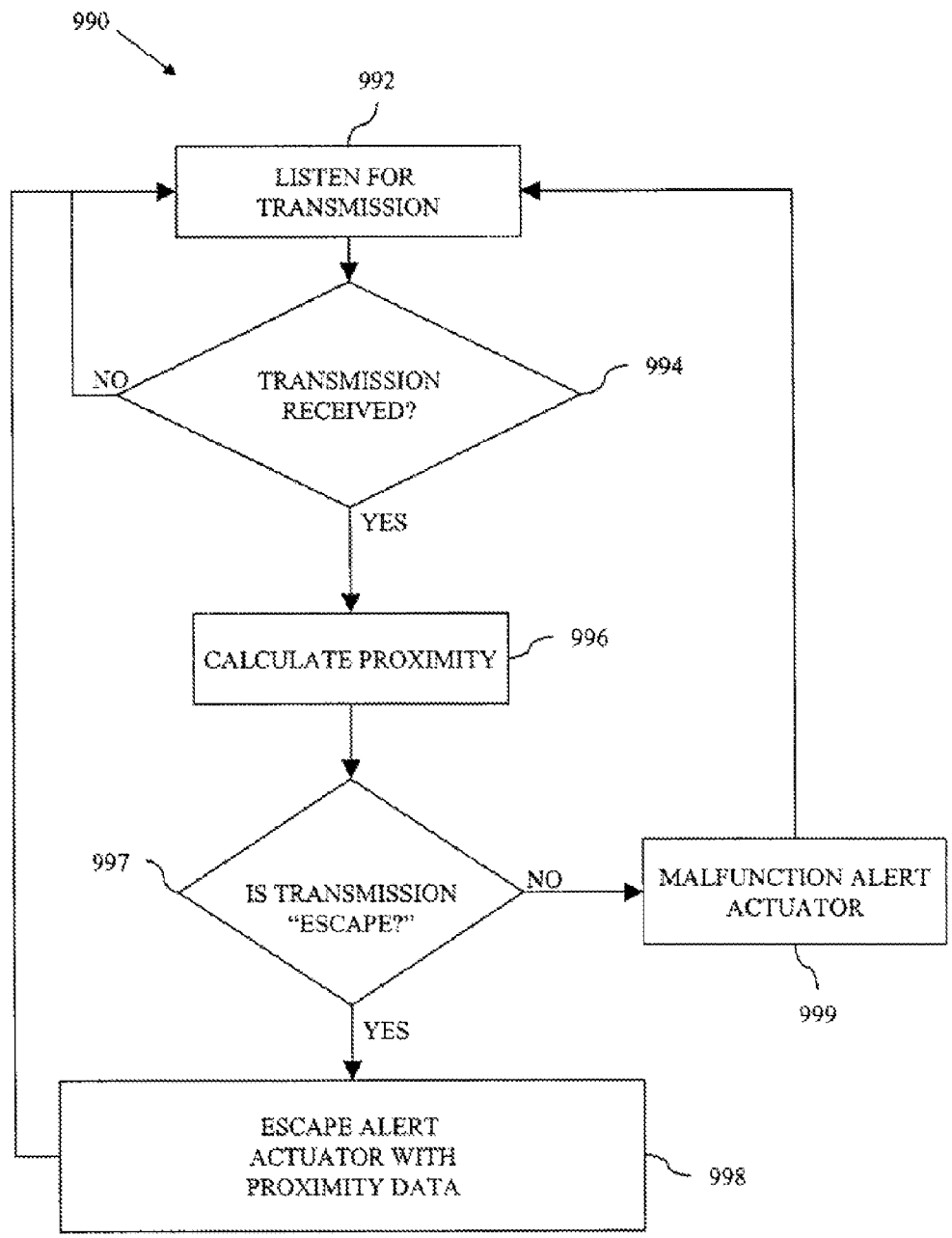
FIG. 9G is a flow-chart diagram of at least a portion of an embodiment of logic structure according to aspects of the present disclosure.

Referring to FIG. 9G, illustrated is at least a portion of an embodiment of logic structure 990 for an implementation regarding the case of when an animal 905 comes into proximity of a fence-post device 920 and crosses over the perimeter boundary. The wireless device 910 begins to communicate to the fence-post device 920 in a step 992 and, when an animal 905 comes into a predetermined proximity of the fence-post device 920, as determined by a decisional step 994, the calculation of the proximity of the animal 905 relative to the fence-post device 920 begins in a step 996 (else listening continues in step 992). As the fence-post device 920 calculates the proximity of the animal 905 via the wireless device 910, the fence-post device 920 begins to issue "minor" signals, followed by "large" signals, as described above, to further deter the animal 905 as the animal gets the closer to the fence-post device 920.

Once the fence-post device 920 perimeter boundary is crossed by the animal 905, which may indicate that the animal 905 has escaped or is in danger of escaping, as determined by a decisional step 997, the wireless device 910 of that animal 905 continues to issue "larger" jolts in accordance with the proximity calculations performed by the fence-post device 920. As the animal 905 (and its wireless device 910) exit the range of the fence-post device 920 on the outside of the perimeter, proximity measurements and "larger" and "minor" jolt signals and escape alert status notifications continue to be issued from the fence-post device 920, and may be similarly forwarded through adjacent fence-post devices 920 back to the peripheral base station 930 and finally to the operator's console 940. For example, the operator's console 940 may indicate the animal escape status as well as the last-transmitted proximity data, which may be sent in a step 998, as a notification that intervention is required in returning the animal 905 to within the designated safe zone.

Figure 10:
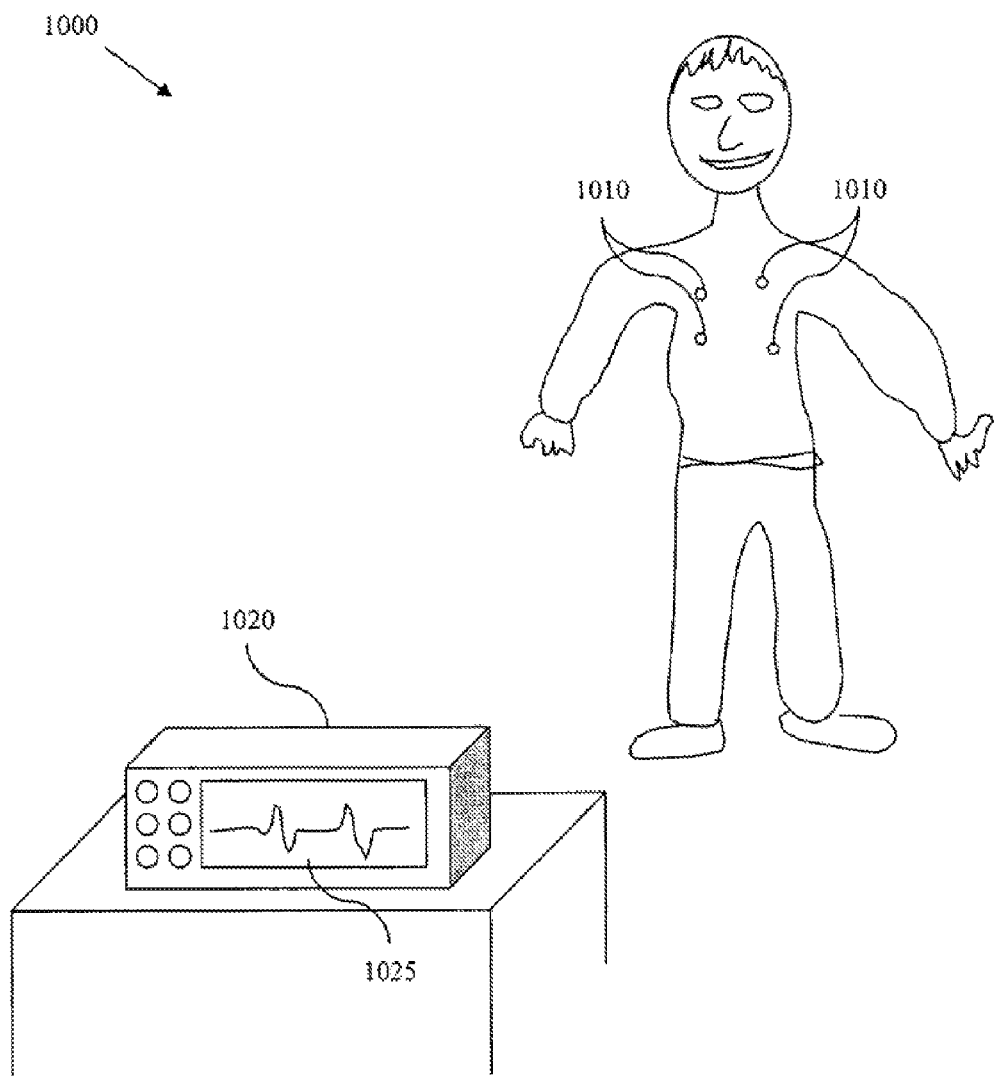
FIG. 10 is a schematic view of a system and apparatus according to aspects of the present disclosure.

Referring to FIG. 10, illustrated is a schematic view of at least a portion of an embodiment of a system 1000 according to aspects of the present disclosure. The system 1000 is one environment in which the apparatus 700, 800*a*, 800*b*, 800*c*, 800*d* and/or 800*e* described above may be implemented. FIG. 10 illustrates the operation of one or more wireless devices 1010 which may each be configured to transmit heart waveforms as part of an ECG. The wireless devices 1010 may each be substantially similar to one or more of the apparatus 700, 800*a*, 800*b*, 800*c*, 800*d* and/or 800*e* described above, among others within the scope of the present disclosure. For example, the wireless devices 1010 may include an IC chip having at least a portion configured to sense or communicate with an associated sensing device to detect the heart waverforms and/or related electrical signals. The wireless devices 1010 may also include an antenna, such that the detected signals and/or information related thereto may be transmitted to a peripheral base unit 1020. The peripheral unit 1020 may be configured to receive the signals transmitted from the wireless devices 1010, and possibly to perform various processing of the signals and/or display the signals and/or related information on an analog and/or digital display 1025. The wireless devices 1010 may be implantable, such that they may be used repeatedly. Consequently, the packaging material enclosing the collocated components of the wireless devices 1010 may be surgically sterile. However, the wireless devices 1010 may also be disposable, one-time-use products, possibly having adhesive on one surface thereof to adhere the devices 1010 to the test subject for the duration of the ECG, such that the wireless devices 1010 may be subsequently removed with ease, and subsequently discarded.

Figure 11:
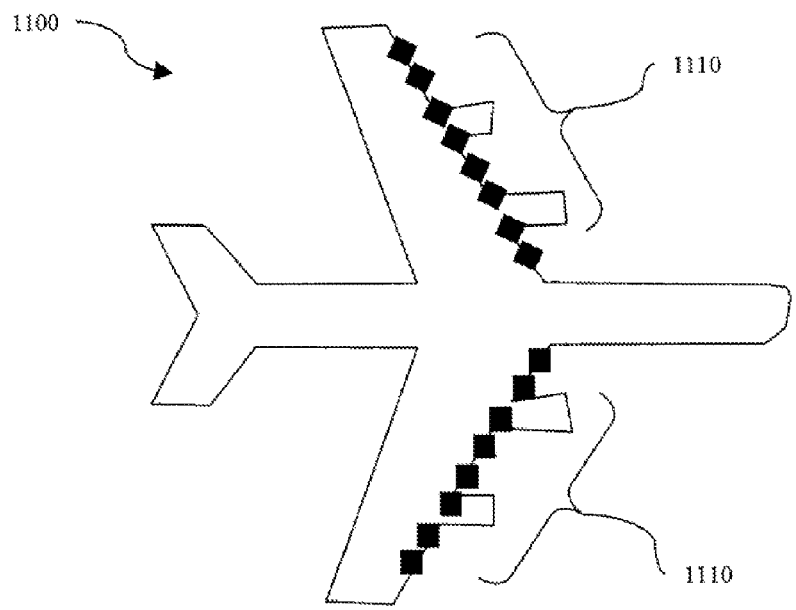
FIG. 11 is a schematic view of a system and apparatus according to aspects of the present disclosure.

Referring to FIG. 11, illustrated is a schematic view of at least a portion of an embodiment of a system 1100 according to aspects of the present disclosure. The system 1100 is one environment in which the apparatus 700, 800*a*, 800*b*, 800*c*, 800*d* and/or 800*e* described above may be implemented, among others within the scope of the present disclosure. FIG. 11 illustrates the operation of wireless devices 1110 which may be configured to sense and/or transmit environmental data such as temperature, pressure, wind speed and direction, and/or humidity, and/or mechanical data such as that relating to the operation of one of various mechanical components within a modern aircraft. The devices 1110 may also be configured for and utilized as wireless actuators for various mechanical components such as elements of the propulsion device or wing aerodynamics. The advantages of such wireless devices used in such implementations may include the ability to decrease the quantity of wiring within the structure of the aircraft. Outdated wiring can fray and lead to arcing or sparking of electrical energy from one wire to another, which can in turn cause ignition of proximate flammable materials or a chain reaction with potentially catastrophic results. Wireless, self-powered sensors and transmitters, however, may eliminate the need for such wiring and can result in a significantly safer aircraft.

Figure 12:
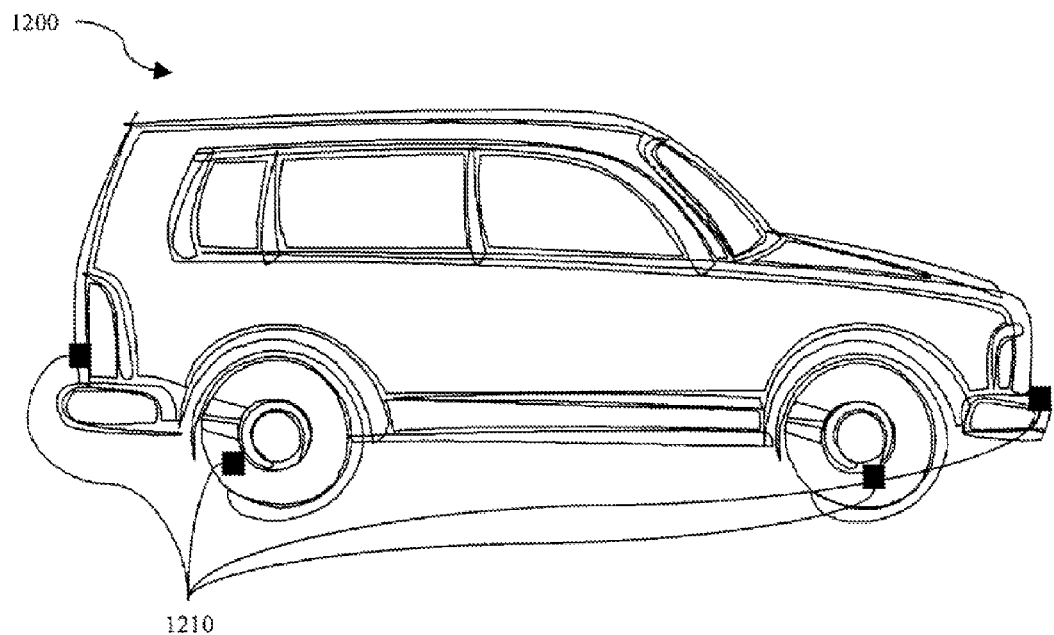
FIG. 12 is a schematic view of a system and apparatus according to aspects of the present disclosure.

Referring to FIG. 12, illustrated is a schematic view of at least a portion of an embodiment of a system 1200 according to aspects of the present disclosure. The system 1200 is one environment in which the apparatus 700, 800*a*, 800*b*, 800*c*, 800*d* and/or 800*e* described above may be implemented, among others within the scope of the present disclosure. FIG. 12, similar to that of FIG. 11, illustrates an automotive embodiment in which wireless, self-powered sensors or actuators 1210 may be configured for and utilized as tire pressure sensors, speed detectors, road condition sensors, and/or actuators for one or more of various mechanical elements within a modern automotive manufacture.

The foregoing has outlined features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An apparatus, comprising:
   a first communication apparatus comprising:
   an antenna;
   an integrated circuit chip comprising wireless communication circuitry operable for wireless communication, via the antenna, between the first communication apparatus and at least one of a plurality of second communication apparatuses that is physically separated from the first communication apparatus;
   an energy supply electrically coupled to the integrated circuit chip;
   an energy harvesting device operable to generate electrical energy supplied to the energy supply; and
   a material substantially enclosing the integrated circuit chip and at least one of:
   at least a portion of the antenna;
   at least a portion of the energy supply; and
   at least a portion of the energy harvesting device.

2. The apparatus of claim 1 wherein the first communication apparatus is configured to wirelessly communicate indirectly with at least one of the plurality of second communication apparatuses via at least one intermediate device.

3. The apparatus of claim 1 wherein:
the apparatus further comprises the plurality of second communication apparatuses;
the antenna is a first antenna;
the integrated circuit chip is a first integrated circuit chip;
the energy supply is a first energy supply; and
each of the plurality of second communication apparatuses comprises a second antenna, a second integrated circuit chip, and a second energy supply.

4. The apparatus of claim 3 wherein the energy harvesting device is a first energy harvesting device, and wherein each of the plurality of second communication apparatuses further comprises a second energy harvesting device.

5. The apparatus of claim 1 wherein the first communication apparatus is operable within at least one of a static environment, a quasi-mobile environment, and a mobile environment.

6. The apparatus of claim 1 wherein the first communication apparatus is operable within an environment in which at least one of the first and second communication apparatuses is positionally fixed.

7. The apparatus of claim 6 wherein at least one other one of the first and second communication apparatuses is mobile within the environment.

8. The apparatus of claim 1 wherein the energy supply is a multi-layer thin-film device.

9. An apparatus, comprising:
a network comprising a plurality of components each configured to communicate with another of the plurality of components, wherein the plurality of components comprises:
a base station; and
an electronic device;
wherein at least one of the base station and the electronic device is an autonomous device comprising:
an integrated circuit chip;
an energy supply electrically coupled to the integrated circuit chip;
an energy harvesting device operable to generate energy supplied to the energy supply;
an antenna associated with the integrated circuit; and
an encapsulating material containing the integrated circuit chip, the energy supply, the energy harvesting device, and the antenna, wherein the encapsulating material permits transmission of wireless signals to and/or from the antenna.

10. The apparatus of claim 9 wherein the plurality of components further comprises an intermediate unit, and wherein the autonomous device is one of the base station, the electronic device, and the intermediate unit.

11. The apparatus of claim 9 wherein the autonomous device communicates signals wirelessly to and from another of the plurality of components.

12. The apparatus of claim 9 wherein the autonomous device further comprises a micro-electro-mechanical (MEMS) component.

13. The apparatus of claim 9 wherein at least one of the integrated circuit chip, the energy supply, and the energy harvesting device has a feature dimension other than thickness that is less than about 100 nm.

14. The apparatus of claim 9 wherein the integrated circuit chip is operable to make a determination or decision based on a signal received from another of the plurality of components.

15. The apparatus of claim 9 wherein the autonomous device further comprises a sensor operable to sense a characteristic of an environment in which the autonomous device is situated, and wherein the integrated circuit chip is operable to make determination or decision based on information received from the sensor.

16. The apparatus of claim 9 wherein at least one of the autonomous device and the integrated circuit chip is substantially spherical or otherwise non-planar.

17. The apparatus of claim 9 wherein the autonomous device is implanted into a living human or other animal.

18. The apparatus of claim 9 wherein the autonomous device further comprises means for attachment to a living human or other animal.

19. The apparatus of claim 9 wherein at least an outer surface of the autonomous device is surgically sterile.

20. An apparatus, comprising:
a network comprising a plurality of network components each configured to communicate wirelessly with another of the plurality of network components, wherein the plurality of network components comprises:
a base station; and
an electronic device;
wherein at least one of the base station and the electronic device is an autonomous device comprising a plurality of collocated device components, and wherein the plurality of collocated device components comprises:
an integrated circuit chip;
an energy supply electrically coupled to the integrated circuit chip; and
an energy harvester operable to generate energy supplied to the energy supply.

21. The apparatus of claim 20 wherein the autonomous device further comprises a material at least partially enclosing each of the integrated circuit chip, the energy supply, and the energy harvester.

* * * * *